US012796130B2

(12) United States Patent
Katayama

(10) Patent No.: US 12,796,130 B2
(45) Date of Patent: Nov. 10, 2026

(54) LIGHT RECEIVING ELEMENT, LIGHT RECEIVING DEVICE, AND ELECTRONIC DEVICE

(71) Applicant: SONY SEMICONDUCTOR SOLUTIONS CORPORATION, Kanagawa (JP)

(72) Inventor: Hiroshi Katayama, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 535 days.

(21) Appl. No.: 18/255,533

(22) PCT Filed: Nov. 30, 2021

(86) PCT No.: PCT/JP2021/043778
§ 371 (c)(1),
(2) Date: Jun. 1, 2023

(87) PCT Pub. No.: WO2022/124131
PCT Pub. Date: Jun. 16, 2022

(65) Prior Publication Data

US 2024/0021632 A1 Jan. 18, 2024

(30) Foreign Application Priority Data

Dec. 11, 2020 (JP) ................................. 2020-206044

(51) Int. Cl.
*H10F 39/00* (2025.01)
*H04N 25/77* (2023.01)

(52) U.S. Cl.
CPC ....... *H10F 39/80373* (2025.01); *H04N 25/77* (2023.01); *H10F 39/014* (2025.01); *H10F 39/8027* (2025.01); *H10F 39/807* (2025.01)

(58) Field of Classification Search
CPC ... H04N 25/77; H10F 39/182; H10F 39/8027; H10F 39/8037; H10F 39/80373; H10F 39/807
See application file for complete search history.

(56) References Cited

U.S. PATENT DOCUMENTS

2009/0303371 A1 12/2009 Watanabe et al.
2016/0020237 A1* 1/2016 Yamakawa ........... H04N 25/63 257/233

(Continued)

FOREIGN PATENT DOCUMENTS

JP 2010-114273 5/2010
JP 2016162788 A 9/2016

(Continued)

OTHER PUBLICATIONS

International Search Report and Written Opinion prepared by the Japan Patent Office on Feb. 10, 2022, for International Application No. PCT/JP2021/043778, 2 pgs.

*Primary Examiner* — Daniel M Pasiewicz
(74) *Attorney, Agent, or Firm* — SHERIDAN ROSS P.C.

(57) ABSTRACT

Provided is a light receiving element including a semiconductor substrate, a photoelectric conversion unit (PD) that is provided in the semiconductor substrate and converts light into charges, a charge holding unit (FD) that is provided in the semiconductor substrate and holds the charges, and a transfer transistor (VG) that transfers the charges from the photoelectric conversion unit to the charge holding unit, in which the transfer transistor includes a gate electrode having a pair of first embedded gate units embedded in the semiconductor substrate.

20 Claims, 19 Drawing Sheets

(56) References Cited

U.S. PATENT DOCUMENTS

| | | | | |
|---|---|---|---|---|
| 2016/0218138 | A1* | 7/2016 | Oishi | H10F 39/812 |
| 2016/0268322 | A1 | 9/2016 | Watanabe | |
| 2018/0033816 | A1 | 2/2018 | Fukuoka et al. | |
| 2021/0255282 | A1 | 8/2021 | Katayama | |
| 2022/0199660 | A1* | 6/2022 | Lee | H04N 25/59 |

FOREIGN PATENT DOCUMENTS

| | | | |
|---|---|---|---|
| JP | 2017-055050 | | 3/2017 |
| JP | 2020009883 | A | 1/2020 |
| KR | 20090127828 | A | 12/2009 |
| KR | 20160077055 | A | 7/2016 |
| TW | I645551 | B | 12/2018 |
| TW | 202044335 | A | 12/2020 |
| WO | WO 2016/136487 | | 9/2016 |
| WO | WO 2020/008907 | | 1/2020 |
| WO | WO-2020209107 | A1 | 10/2020 |

* cited by examiner

LIGHT RECEIVING ELEMENT, LIGHT RECEIVING DEVICE, AND ELECTRONIC DEVICE

CROSS REFERENCE TO RELATED APPLICATIONS

This application is a national stage application under 35 U.S.C. 371 and claims the benefit of PCT Application No. PCT/JP2021/043778, having an international filing date of 30 Nov. 2021, which designated the United States, which PCT application claimed the benefit of Japanese Patent Application No. 2020-206044, filed 11 Dec. 2020, the entire disclosures of each of which are incorporated herein by reference.

FIELD

The present disclosure relates to a light receiving element, a light receiving device, and an electronic device.

BACKGROUND

A complementary MOS (CMOS) solid-state imaging element, which can be manufactured by a process similar to that of a metal-oxide-semiconductor (MOS) integrated circuit, can be applied as a pixel (light receiving element) in an imaging device (light receiving device) that captures an image of a subject. The CMOS solid-state imaging element includes a photodiode that generates charges according to the amount of received light, a MOS transistor for transferring the charges from the photodiode, and a floating diffusion region that accumulates the charges. The charges temporarily accumulated in the CMOS solid-state imaging element are processed by a predetermined signal processing circuit and output to the outside as a video signal. As an example of such a solid-state imaging element, the element described in Patent Literature 1 can be given.

CITATION LIST

Patent Literature

Patent Literature 1: JP 2010-114273 A

SUMMARY

Technical Problem

In the CMOS solid-state imaging element (light receiving element), charges are transferred from the photodiode to the floating diffusion region by modulating the potential in the semiconductor substrate with a gate electrode of the MOS transistor. However, in the conventional CMOS solid-state imaging elements, it is difficult to modulate the potential to a desired potential, and a charge transfer failure may occur.

As a method of preventing a transfer failure, it is conceivable to modulate the potential to a deep region in the semiconductor substrate by using a vertical transfer transistor having an embedded unit embedded in the semiconductor substrate, for example. However, the modulation degree becomes too large, and a part having a deep potential may be generated locally. Since charges are likely to remain in the part, charges required to be transferred to the floating diffusion region return from the part to the photodiode, and a charge transfer failure occurs when the vertical transfer transistor is turned off.

The present disclosure proposes a light receiving element, a light receiving device, and an electronic device capable of avoiding occurrence of charge transfer failure.

Solution to Problem

According to the present disclosure, there is provided a light receiving element including: a semiconductor substrate; a photoelectric conversion unit that is provided in the semiconductor substrate and converts light into charges; a charge holding unit that is provided in the semiconductor substrate and holds the charges; and a transfer transistor that transfers the charges from the photoelectric conversion unit to the charge holding unit. In the light receiving element, the transfer transistor includes a gate electrode having a pair of first embedded gate units embedded in the semiconductor substrate.

Furthermore, according to the present disclosure, there is provided a light receiving device including a plurality of light receiving elements. In the light receiving device, each of the light receiving elements includes: a semiconductor substrate; a photoelectric conversion unit that is provided in the semiconductor substrate and converts light into charges; a charge holding unit that is provided in the semiconductor substrate and holds the charges; and a transfer transistor that transfers the charges from the photoelectric conversion unit to the charge holding unit, and the transfer transistor includes a gate electrode having a pair of first embedded gate units embedded in the semiconductor substrate.

Furthermore, according to the present disclosure, there is provided an electronic device on which a light receiving device having a plurality of light receiving elements is mounted. In the light receiving device, each of the light receiving elements includes: a semiconductor substrate; a photoelectric conversion unit that is provided in the semiconductor substrate and converts light into charges; a charge holding unit that is provided in the semiconductor substrate and holds the charges; and a transfer transistor that transfers the charges from the photoelectric conversion unit to the charge holding unit, and the transfer transistor includes a gate electrode having a pair of first embedded gate units embedded in the semiconductor substrate.

DESCRIPTION OF EMBODIMENTS

Figure 1:
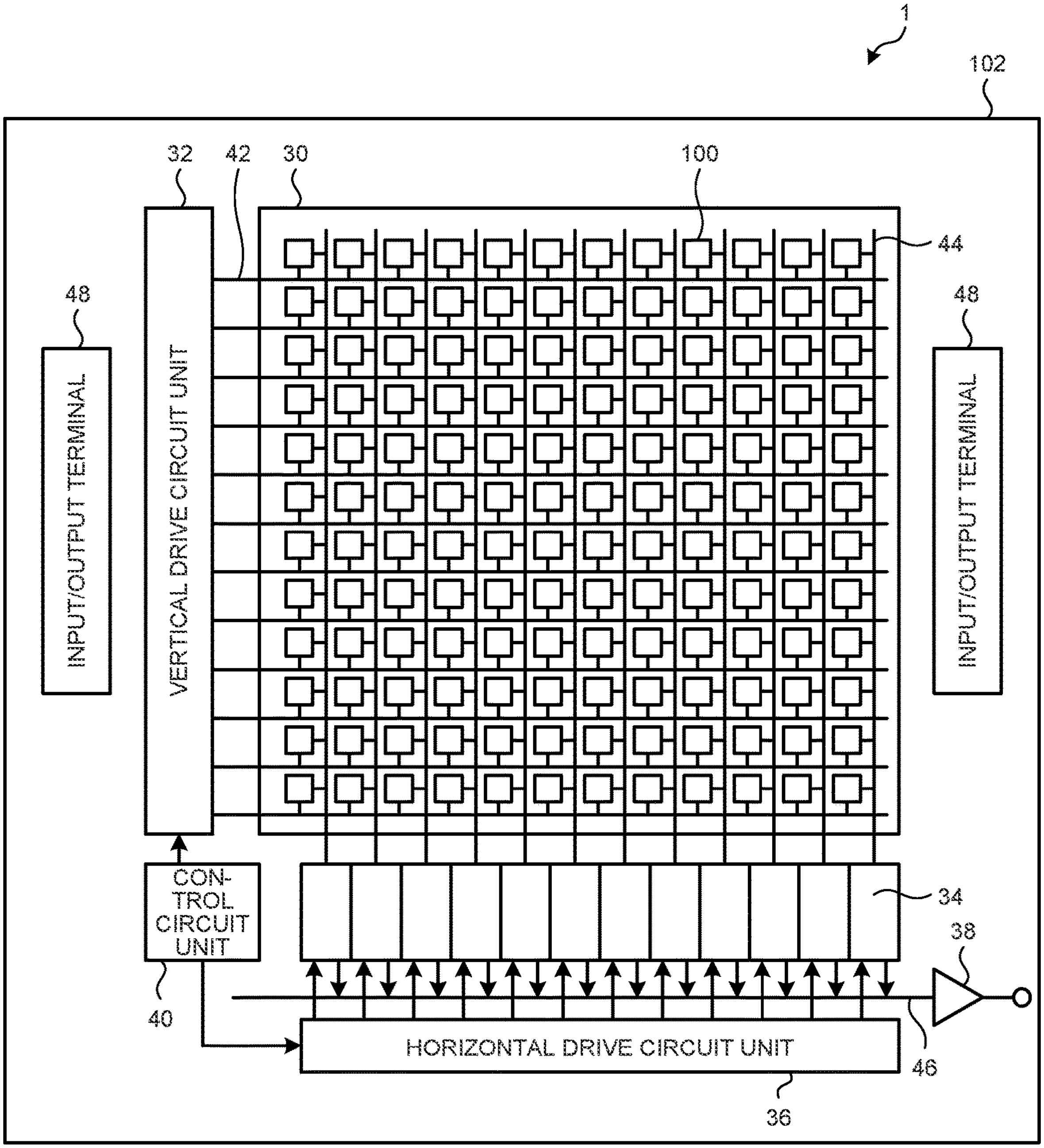
FIG. 1 is a diagram illustrating a schematic configuration of an example of an imaging device 1 applied to each embodiment of the present disclosure.

Hereinafter, preferred embodiments of the present disclosure will be described in detail with reference to the accompanying drawings. In the present specification and the drawings, components having substantially the same functional configuration are denoted by the same reference signs, and redundant description is omitted.

In the present specification and the drawings, a plurality of components having substantially the same or similar functional configuration may be distinguished by attaching different numerals after the same reference signs. However, in a case where it is not particularly necessary to distinguish each of the plurality of components having substantially the same or similar functional configuration, only the same reference sign is assigned. Similar components of different embodiments may be distinguished by adding different alphabets after the same reference signs. However, in a case where it is not necessary to particularly distinguish each of similar components, only the same reference sign is assigned.

The drawings referred to in the following description are drawings for describing the embodiments of the present disclosure and promoting understanding thereof, and shapes, dimensions, ratios, and the like illustrated in the drawings may be different from actual ones for the sake of clarity. The elements illustrated in the drawings, components included in the devices, and the like may be appropriately modified in design in consideration of the following description and known technologies.

In the following description, a case where an embodiment of the present disclosure is applied to a back-illuminated light receiving device (imaging device) will be described as an example. Thus, in the light receiving device, light is incident from the back surface side of a semiconductor substrate. Thus, in the following description, the front surface of the semiconductor substrate is a surface opposite to the back surface when the surface on the light incident side is the back surface. The embodiments of the present disclosure are applied not only to a back-illuminated light receiving device but may also be applied to, for example, a front-illuminated light receiving device.

The description of specific shapes in the following description does not mean only geometrically defined shapes. Specifically, the description of specific shapes and the like in the following description include a case where there is an allowable difference (error/distortion) in elements, their manufacturing process, and their use/operation, and a shape similar to the shapes. For example, in the following description, the expression "circular shape" or "substantially circular shape" means that the shape is not limited to a perfect circle but includes a shape similar to a perfect circle such as an elliptical shape.

In the following description of circuits (electrical connections), unless otherwise specified, "electrically connected" means that a plurality of elements are connected to conduct electricity (signals). In addition, "electrically connected" in the following description includes not only a case of directly and electrically connecting a plurality of elements but also a case of indirectly and electrically connecting a plurality of elements via other elements.

In the following description, "shared" means that an element is provided to be shared by a plurality of some other elements, in other words, the element is shared by a predetermined number of some other elements, unless otherwise specified.

The description will be given in the following order.

1. Configuration example of imaging device 1 according to embodiment of present disclosure
2. Equivalent circuit example of imaging element 100 according to embodiment of present disclosure
3. Background of creation of present embodiment 4. First embodiment
5. Second embodiment
6. Third embodiment
7. Fourth embodiment
8. Fifth embodiment
9. Sixth embodiment
10. Conclusion
11. Configuration example of electronic device
12. Application example to endoscopic surgical system
13. Application example to mobile body
14. Supplement

1. Configuration Example of Imaging Device 1 According to Embodiment of Present Disclosure A schematic configuration of an example of a complementary metal oxide semiconductor (CMOS) solid-state imaging device (light receiving device) 1 applied to each embodiment of the present disclosure will be described with reference to FIG. 1. FIG. 1 is a diagram illustrating a schematic configuration of an example of the imaging device 1 applied to each embodiment of the present disclosure.

Specifically, as illustrated in FIG. 1, the imaging device 1 includes a pixel region (so-called imaging region) 30 in which imaging elements (light receiving elements) 100 are regularly arranged in a two-dimensional manner (in a matrix), and a peripheral circuit unit, which are provided on a semiconductor substrate 102 such as a silicon substrate. The imaging element 100 includes, for example, a photodiode serving as a photoelectric conversion unit and a plurality of pixel transistors (so-called MOS transistors). The plurality of pixel transistors may include a transfer transistor, a reset transistor, and an amplification transistor, for example. The plurality of pixel transistors may also include a selection transistor. The imaging element 100 may have a sharing pixel structure in which one floating diffusion region (charge holding unit) and a plurality of pixel transistors are shared among the plurality of imaging elements 100.

The peripheral circuit unit includes a vertical drive circuit unit 32, a column signal processing circuit unit 34, a horizontal drive circuit unit 36, an output circuit unit 38, and a control circuit unit 40.

The control circuit unit 40 receives an input clock and data instructing an operation mode or the like, and it outputs data such as internal information of the imaging device 1. That is, the control circuit unit 408 generates a clock signal and a control signal to be a reference of operations of the vertical drive circuit unit 32, the column signal processing circuit unit 34, the horizontal drive circuit unit 36, and the like based on a vertical synchronization signal, a horizontal synchronization signal, and a master clock. These signals are input to the vertical drive circuit unit 32, the column signal processing circuit unit 34, the horizontal drive circuit unit 36, and the like.

The vertical drive circuit unit 32 is composed of a shift register, for example, and it selects a pixel drive wiring 42, supplies a pulse for driving the imaging element 100 to the selected pixel drive wiring 42, and drives the imaging element 100 in units of rows. That is, the vertical drive circuit unit 32 selectively scans each imaging element (pixel) 100 in a pixel region 30 sequentially in the vertical direction in units of rows. Then, the vertical drive circuit unit 32 supplies a pixel signal to the column signal processing circuit unit 34 via a vertical signal line 44 based on signal charges generated according to the amount of received light in, for example, a photodiode serving as a photoelectric conversion unit of each imaging element 100.

The column signal processing circuit unit 34 is arranged for each column of the imaging elements 100, for example, and performs signal processing such as noise removal on the signals output from the imaging elements 100 for one row. That is, the column signal processing circuit unit 34 performs signal processing such as correlated double sampling (CDS) for removing fixed pattern noise unique to the imaging element 100, signal amplification, and analog-digital (AD) conversion. A horizontal selection switch (not illustrated) is provided between the output stage of the column signal processing circuit unit 34 and a horizontal signal line 46.

The horizontal drive circuit unit 36 is composed of a shift register, for example, and it sequentially selects each column signal processing circuit unit 34 by sequentially outputting horizontal scanning pulses and causes each column signal processing circuit unit 34 to output a pixel signal to the horizontal signal line 46.

The output circuit unit 38 performs signal processing on the signals sequentially supplied from each column signal processing circuit unit 34 via the horizontal signal line 46, and it outputs the processed signals. For example, the output circuit unit 38 may perform only buffering or may perform black level adjustment, column variation correction, various digital signal processing, and the like. An input/output terminal 48 exchanges signals with the outside.

Figure 2:
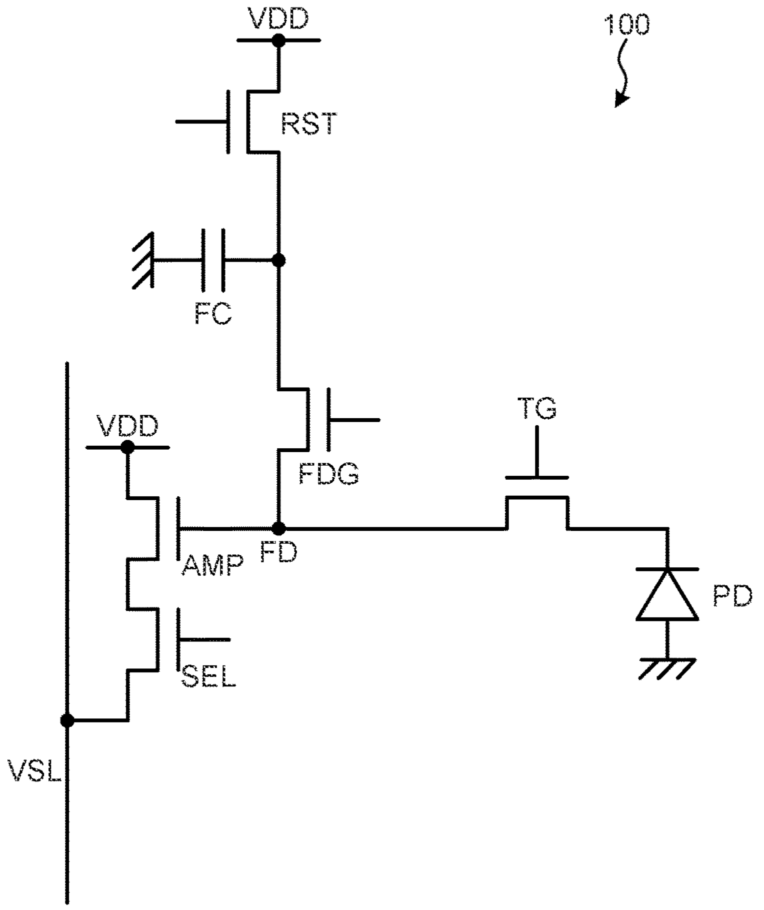
FIG. 2 is an equivalent circuit diagram of an imaging element 100 according to an embodiment of the present disclosure.

2. Equivalent Circuit Example of Imaging Element 100 According to Embodiment of Present Disclosure Next, an example of an equivalent circuit of the imaging element 100 according to an embodiment of the present disclosure will be described with reference to FIG. 2. FIG. 2 is an equivalent circuit diagram of the imaging element 100 according to the embodiment of the present disclosure.

Specifically, as illustrated in FIG. 2, the imaging element 100 includes a photodiode PD as a photoelectric conversion unit that converts light into charges, a transfer transistor TG, a floating diffusion region FD, a reset transistor RST, an amplification transistor AMP, and a selection transistor SEL. The imaging element 100 further includes a conversion efficiency switching transistor FDG and a capacitor FC, as illustrated in FIG. 2.

As illustrated in FIG. 2, in the imaging element 100, one of the source and the drain of the transfer transistor TG is electrically connected to the photodiode PD, and the other of the source and the drain of the transfer transistor TG is electrically connected to the floating diffusion region FD. The transfer transistor TG is brought into a conductive state according to the voltage applied to its own gate (transfer gate) and can transfer the charges generated in the photodiode PD to the floating diffusion region FD.

The floating diffusion region FD is electrically connected to the gate of the amplification transistor AMP that converts (amplifies) charge into voltage and outputs the voltage as a signal (pixel signal). One of the source and the drain of the amplification transistor AMP is electrically connected to one of the source and the drain of the selection transistor SEL that outputs the signal obtained by conversion to a signal line VSL according to the selection signal. The other of the source and the drain of the amplification transistor AMP is electrically connected to a power supply circuit (power supply potential VDD).

The other of the source and the drain of the selection transistor SEL is electrically connected to the signal line VSL that transmits the converted voltage as a signal and is further electrically connected to the column signal processing circuit unit 34 described above. The gate of the selection transistor SEL is electrically connected to a selection line (not illustrated) that selects a row to output the signal and is further electrically connected to the vertical drive circuit unit 32 described above. That is, the charges accumulated in the floating diffusion region FD is converted into a voltage by the amplification transistor AMP under the control of the selection transistor SEL and is output to the signal line VSL.

As illustrated in FIG. 2, one of the source and the drain of the conversion efficiency switching transistor FDG is electrically connected to the floating diffusion region FD, and the other of the source and the drain of the conversion efficiency switching transistor FDG is electrically connected to the capacitor FC. When the amount of incident light to the imaging element 100 is large and the amount of generated charges is large, the conversion efficiency switching transistor FDG is brought into a conductive state according to the voltage applied to its own gate and electrically connects the floating diffusion region FD and the capacitor FC to adjust the amount of charges that can be accumulated.

As illustrated in FIG. 2, the floating diffusion region FD is electrically connected to one of the drain and the source of the reset transistor RST for resetting the accumulated charges via the conversion efficiency switching transistor FDG. The gate of the reset transistor RST is electrically connected to a reset signal line (not illustrated) and is further electrically connected to the vertical drive circuit unit 32 described above. The other of the drain and the source of the reset transistor RST is electrically connected to the power supply circuit (power supply potential VDD). The reset transistor RST is brought into a conductive state according to the voltage applied to its own gate and can reset the charges accumulated in the floating diffusion region FD (discharge to the power supply circuit (power supply potential VDD)).

The equivalent circuit of the imaging element 100 according to the present embodiment is not limited to the example illustrated in FIG. 2 but may include, for example, other elements and the like without particular limitation.

3. Background of Creation of Present Embodiment

Figure 3:
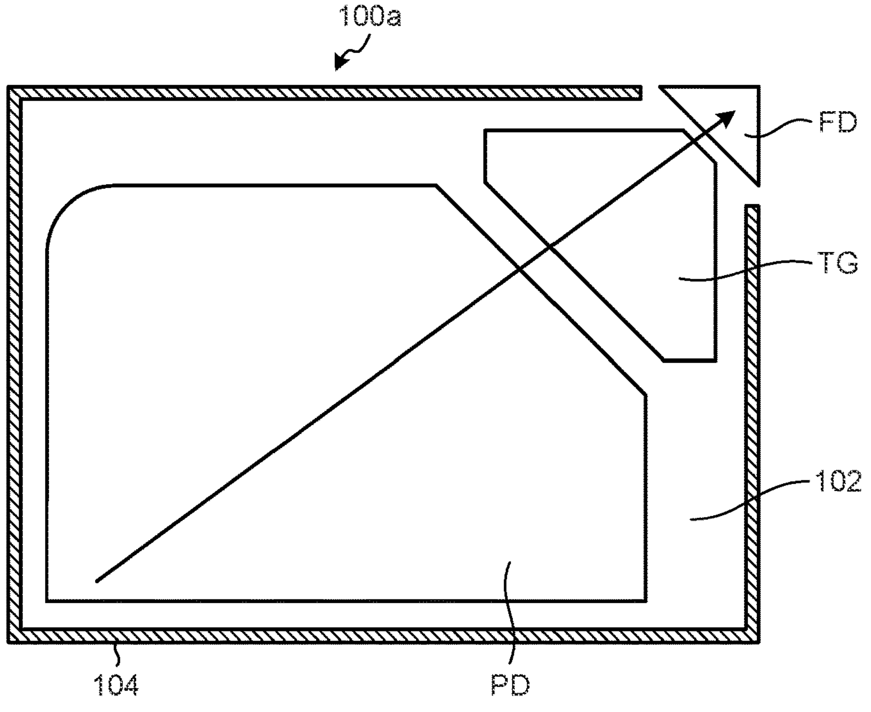
FIG. 3 is a schematic plan view of an imaging element 100*a* according to a comparative example.
Figure 4:
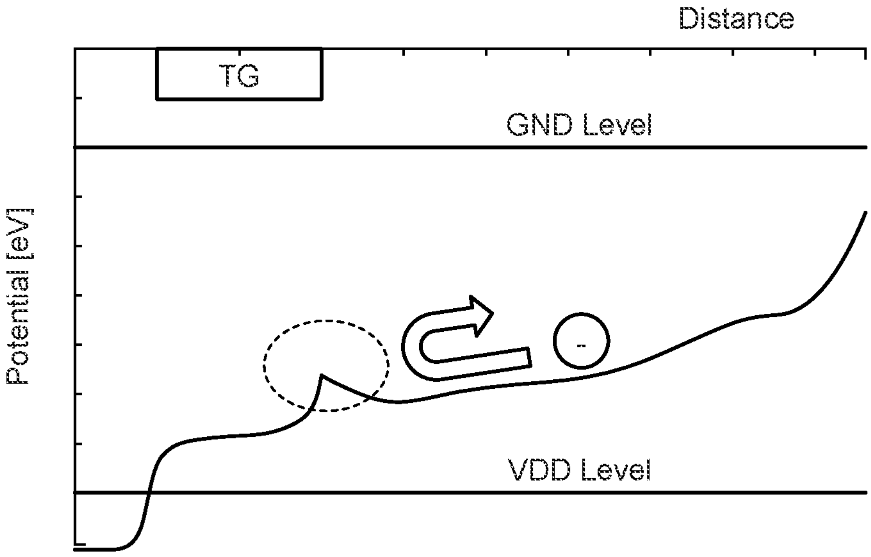
FIG. 4 is a graph illustrating a potential in the imaging element 100*a* according to the comparative example.
Figure 5:
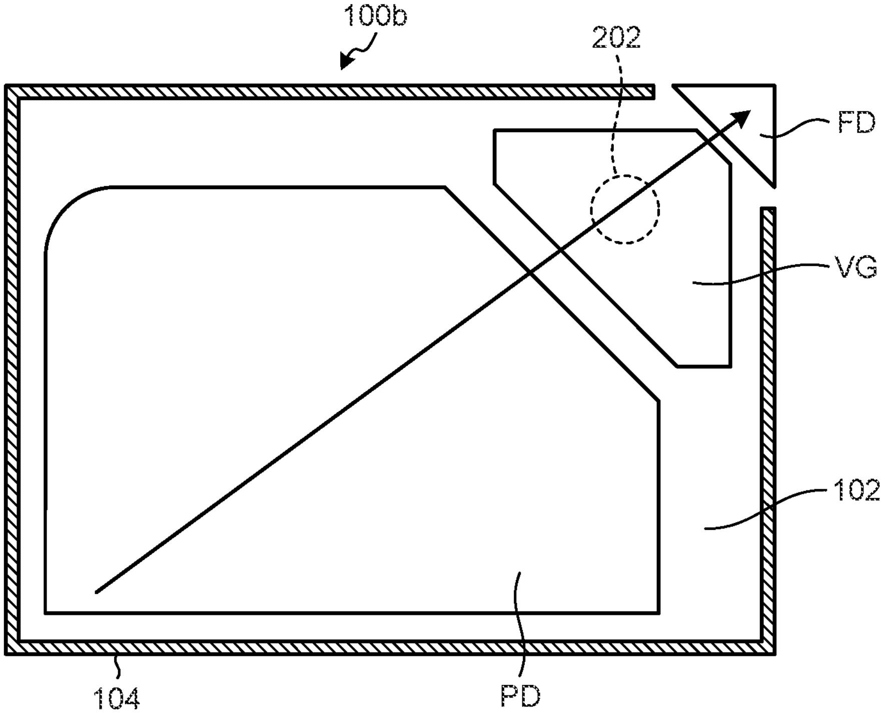
FIG. 5 is a schematic plan view of an imaging element 100*b* according to a comparative example.
Figure 6:
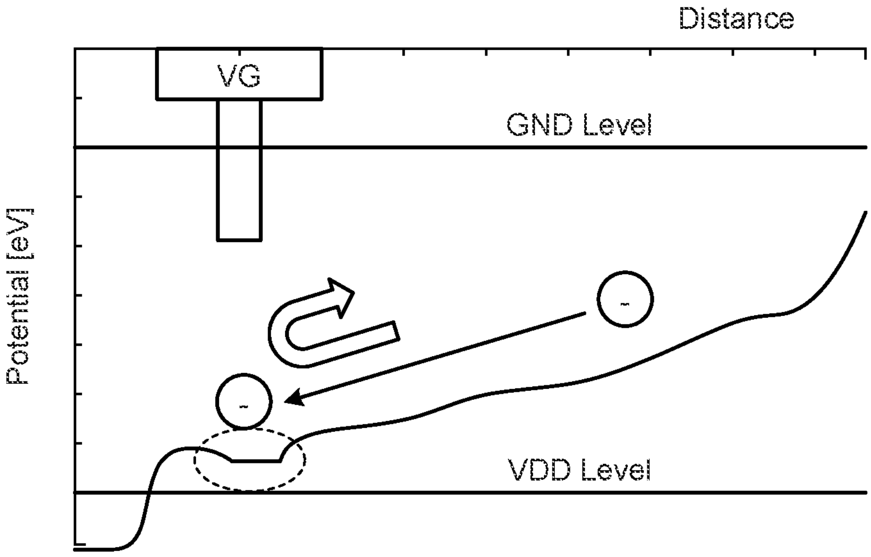
FIG. 6 is a graph illustrating a potential in the imaging element 100*b* according to the comparative example.

A configuration example of the imaging device 1 according to the embodiment of the present disclosure and an equivalent circuit example of the imaging element 100 according to the embodiment of the present disclosure have been described above. Here, before the details of the embodiment of the present disclosure is described, the background leading to the creation of the embodiment of the present disclosure by the inventors of the present disclosure will be briefly described with reference to FIGS. 3 and 4. FIGS. 3 and 5 are schematic plan views of imaging elements 100*a* and 100*b* according to comparative examples, and FIGS. 4 and 6 are graphs illustrating potentials in the imaging elements 100*a* and 100*b* according to the comparative examples. The comparative examples mean the imaging elements 100*a* and 100*b* that have been studied by the inventors of the present disclosure before the embodiment of the present disclosure is made.

The imaging element 100*a* according to a comparative example initially studied by the inventors of the present disclosure has a planar structure as illustrated in FIG. 3. In detail, as illustrated in FIG. 3, the imaging element 100*a* includes a pixel isolation unit 104 that isolates adjacent imaging elements 100*a* provided on the semiconductor substrate 102 from each other, and a photodiode (photoelectric conversion unit) PD that is provided in a region of the semiconductor substrate 102 surrounded by the pixel isolation unit 104 and converts incident light into charges. The imaging element 100*a* further includes the floating diffusion region (charge holding unit) FD that accumulates the charges generated in the photodiode PD, and the transfer transistor TG (FIG. 3 illustrates a gate electrode of the transfer transistor TG) that transfers the charges from the photodiode PD to the floating diffusion region FD. In the rectangular imaging element 100*a*, as illustrated in FIG. 3, the photodiode PD, the transfer transistor TG, and the floating diffusion region FD are arranged in a line in order on a diagonal line of the imaging element 100*a*. In the imaging element 100*a* according to the comparative example, the transfer transistor TG includes a flat-plate-like gate electrode stacked on the semiconductor substrate 102 via an insulating film (not illustrated).

FIG. 4 is a computer simulation of a potential in the semiconductor substrate 102 in the imaging element 100*a*, illustrating the distance from the photodiode PD toward the floating diffusion region FD along the arrow in FIG. 3 from right to left in FIG. 4. In the imaging element 100*a*, the potential in the semiconductor substrate 102 is modulated as illustrated in FIG. 4 by applying a predetermined voltage to the gate electrode of the transfer transistor TG. The modulated potential has a gradient descending from the photodiode PD (right end in FIG. 4) toward the floating diffusion region FD (left end in FIG. 4). Thus, the charges generated in the photodiode PD are transferred toward the floating diffusion region FD according to the gradient.

However, in the transfer transistor TG having the flat-plate-like gate electrode, the modulation degree of the potential is weak, and it is difficult to modulate the potential to a deep region of the semiconductor substrate 102. Thus, in the imaging element 100*a* according to the comparative example, a potential peak (barrier) as indicated by a region surrounded by a broken line in FIG. 4 may be generated in the photodiode PD, in the vicinity of the transfer transistor TG, and the like. For example, to avoid saturation of charges accumulation in the floating diffusion region FD, the potential of the floating diffusion region FD may be made deeper (potential may be lowered) or the width of the floating diffusion region FD may be increased (the width of a part where the potential is deep may be increased). In such a case, the margin between the photodiode PD and the floating diffusion region FD is reduced, and the barrier as described above is likely to be generated. Then, since such a barrier interrupts the charges, it becomes difficult to smoothly transfer the charges generated in the photodiode PD toward the floating diffusion region FD, and a charge transfer failure occurs.

To avoid occurrence of such transfer failure, the inventors of the present disclosure have conceived of replacing the transfer transistor TG with a vertical transfer transistor VG having a vertical gate structure (VG structure). Since the gate electrode of the vertical transfer transistor VG has a vertical gate structure, it can be expected to modulate the potential to a deep region of the semiconductor substrate 102. Thus, the inventors of the present disclosure have considered that the generation of the barrier can be reduced, and the transfer failure described above can be prevented. Next, in view of such a circumstance, an imaging element 100*b* according to a comparative example then conceived by the inventors of the present disclosure will be described.

In the imaging element 100*b* then conceived by the inventor of the present disclosure, as illustrated in FIG. 5, the photodiode PD, the vertical transfer transistor VG, and the floating diffusion region FD are arranged in a line in order on a diagonal line of the rectangular imaging element 100*b*, in the same manner as in the imaging element 100*a*. Further, the vertical transfer transistor VG includes a flat-plate-like gate electrode stacked on the semiconductor substrate 102 via an insulating film (not illustrated), and an embedded unit 202 (indicated by a broken line in FIG. 5) embedded in the semiconductor substrate 102 via an insulating film (not illustrated). The vertical transfer transistor VG can modulate the potential to a deep region of the semiconductor substrate 102 by having the embedded unit 202 embedded in the semiconductor substrate 102. Since the potential can be modulated to a deep region of the semiconductor substrate 102 by using such a vertical transfer transistor VG, the inventors of the present disclosure have expected elimination of generation of a peak (barrier) of the potential in the photodiode PD, in the vicinity of the transfer transistor TG, and the like.

FIG. 6 is a computer simulation of a potential in the semiconductor substrate 102 in the imaging element 100*b*, illustrating the distance from the photodiode PD toward the floating diffusion region FD along the arrow in FIG. 5 from right to left in FIG. 6. In the imaging element 100*b*, the potential in the semiconductor substrate 102 is modulated as illustrated in FIG. 6 by applying a predetermined voltage to the gate electrode of the vertical transfer transistor VG. The modulated potential has a gradient descending from the photodiode PD (right end in FIG. 6) toward the floating diffusion region FD (left end in FIG. 6). Thus, the charges generated in the photodiode PD are transferred toward the floating diffusion region FD according to the gradient. Further, as illustrated in FIG. 6, in the imaging element 100*b*, no potential peak (barrier) is generated in the photodiode PD, in the vicinity of the vertical transfer transistor VG, and the like. Thus, the charges can be smoothly transferred from the photodiode PD toward the diffusion region FD without being interrupted by the barrier, and a charge transfer failure does not occur.

However, in the imaging element 100*b*, as illustrated in the region surrounded by a broken line in FIG. 6, the modulation degree becomes too large, and a part where the potential is deep is locally generated in the semiconductor substrate 102 below the vertical transfer transistor VG. Charges are likely to remain in such a part where the potential is deep. Further, when the vertical transfer transistor VG is turned off with the charges remaining in such a part where the potential is locally deep, charges that need to be transferred to the floating diffusion region FD return from the part to the photodiode PD (signal return, pumping), and a charge transfer failure occurs.

In view of the circumstance described above, the inventors of the present disclosure intensively studied the structure of the imaging element 100 to avoid occurrence of transfer failure and has created a first embodiment of the present disclosure described below. In the first embodiment of the present disclosure created by the inventors, a fin type vertical transfer transistor VG having a pair of embedded units 202 embedded in the semiconductor substrate 102 is used as the transfer transistor. In the present embodiment, the potential can be modulated as desired in an improved manner to a deep region of the semiconductor substrate 102 by using such a vertical transfer transistor VG. Thus, the present embodiment can avoid generation of a potential peak (barrier) in the photodiode PD, in the vicinity of the transfer transistor TG, and the like, unlike the imaging element 100*a* according to the comparative example. Further, the present embodiment can avoid local generation of a part having a deep potential, unlike the imaging element 100*b* according to the comparative example. That is, the present embodiment can eliminate generation of a barrier or a part having a locally deep potential and occurrence of charge transfer failure. Hereinafter, details of such a first embodiment of the present disclosure will be described in order.

4. First Embodiment

Figure 7:
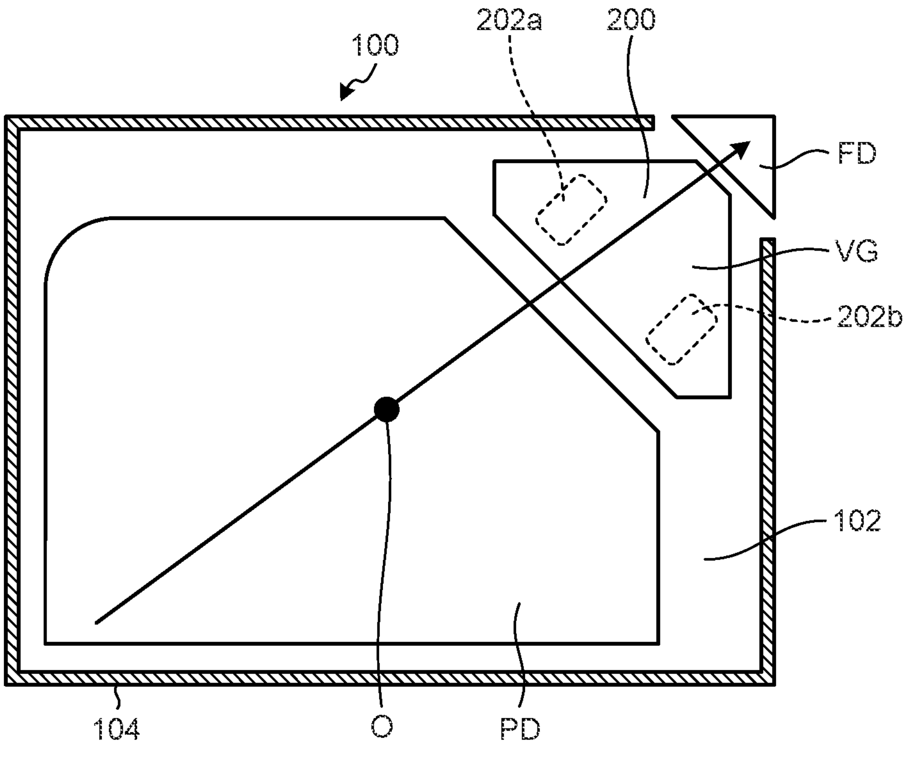
FIG. 7 is a schematic plan view of the imaging element 100 according to a first embodiment of the present disclosure.

First, an example of a planar structure of the imaging element 100 according to the first embodiment of the present disclosure will be described with reference to FIG. 7. FIG. 7 is a schematic plan view of the imaging element 100 according to the present embodiment.

Specifically, as illustrated in FIG. 7, the imaging element (light receiving element) 100 according to the present embodiment includes the pixel isolation unit 104 that isolates adjacent imaging elements 100 provided on the semiconductor substrate 102. The imaging element 100 includes the photodiode (photoelectric conversion unit) PD that is provided in a region of the semiconductor substrate 102 surrounded by the pixel isolation unit 104 and converts incident light into charges. The imaging element 100 further includes the floating diffusion region (charge holding unit) FD that accumulates the charges generated in the photodiode PD, and the vertical transfer transistor VG (FIG. 7 illustrates a gate electrode 200 of the vertical transfer transistor VG) that transfers the charges from the photodiode PD to the floating diffusion region FD. In the rectangular imaging element 100, as illustrated in FIG. 7, the photodiode PD, the vertical transfer transistor VG, and the floating diffusion region FD are arranged in a line in order on a diagonal line of the imaging element 100. More specifically, in the imaging element 100 according to the present embodiment, the photodiode PD is provided at a central part of the imaging element 100, and the floating diffusion region FD is provided at a corner (end part) of the rectangular imaging element 100. The vertical transfer transistor VG is provided between the photodiode PD and the floating diffusion region FD.

In the imaging element 100 according to the present embodiment, the vertical transfer transistor VG includes a flat-plate-like gate electrode 200 stacked on the semiconductor substrate 102 via an insulating film (not illustrated), and a pair of embedded units (first embedded gate unit) 202*a*, 202*b* (indicated by broken lines in FIG. 7) embedded in the semiconductor substrate 102. Each of the pair of embedded units 202 is provided in a substantially rectangular shape on the plane illustrated in FIG. 7 (section obtained by cutting the imaging element 100 along a direction parallel to a surface of the semiconductor substrate 102). Specifically, each embedded unit 202 is formed in a rectangular shape having a long side extending along a direction (arrow in FIG. 7) from the center O of the imaging element 100 toward the center of the floating diffusion region FD on the plane. Thus, the pair of embedded units 202 have a positional relationship of being parallel to each other. An insulating film (first oxide film) made of silicon oxide ($SiO_2$) or the like, which is not illustrated, is provided between the embedded units 202 and the semiconductor substrate 102. In other words, each embedded unit 202 is covered with the insulating film.

In the present embodiment, since the distance between the pair of embedded units 202*a*, 202*b* can be freely increased, the potential at a wide region (a wide region in plan view) in the semiconductor substrate 102 can be modulated. Thus, the present embodiment can decrease not only occurrence of transfer failure as described above but also occurrence of blooming. Here, blooming refers to a phenomenon in which charges flow into adjacent imaging elements 100, an unintended pixel signal is generated in the adjacent imaging elements 100, and an image that should be captured cannot be captured. In the present embodiment, since it is possible to modulate the potential at a wide region (wide region in plan view) in the semiconductor substrate 102, it is possible to transfer a large amount of charges generated in the photodiode PD to the floating diffusion region FD, and it is possible to reduce the flowing out of the charges to adjacent imaging elements 100.

Figure 8:
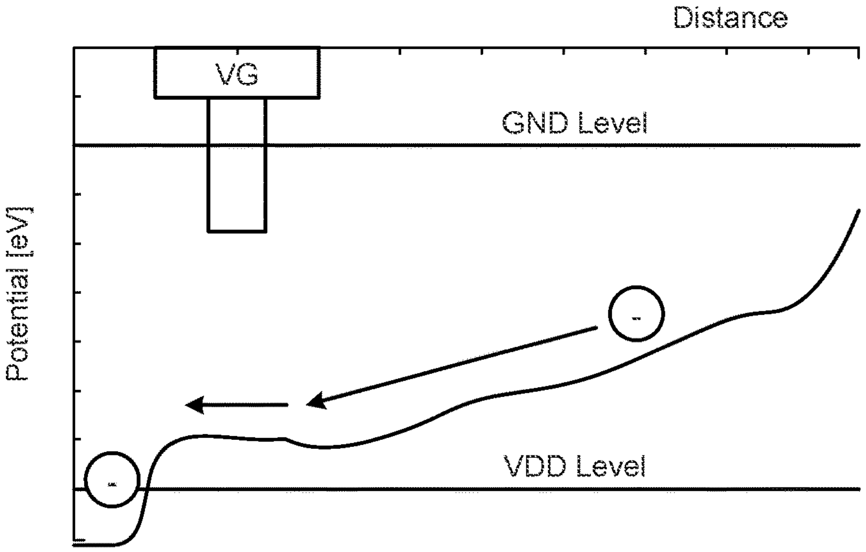
FIG. 8 is a graph illustrating a potential in the imaging element 100 according to the first embodiment of the present disclosure.

FIG. 8 is a computer simulation of a potential in the semiconductor substrate 102 in the imaging element 100, illustrating the distance from the photodiode PD toward the floating diffusion region FD along the arrow in FIG. 7 from right to left in FIG. 8. In the present embodiment, the potential in the semiconductor substrate 102 is modulated as illustrated in FIG. 8 by applying a predetermined voltage to the gate electrode 200 of the vertical transfer transistor VG. The modulated potential has a gradient descending from the photodiode PD (right end in FIG. 8) toward the floating diffusion region FD (left end in FIG. 8). Thus, the charges generated in the photodiode PD are transferred toward the floating diffusion region FD according to the gradient. Further, according to the present embodiment, as illustrated in FIG. 8, no potential peak (barrier) is generated in the photodiode PD, in the vicinity of the transfer transistor TG, and the like, unlike the imaging element 100*a* according to the comparative example. Thus, the charges are smoothly transferred from the photodiode PD toward the diffusion region FD without being interrupted by the barrier.

In addition, in the present embodiment, as illustrated in FIG. 8, the potential is deepened substantially uniformly in the entire semiconductor substrate 102 below the gate electrode 200 of the vertical transfer transistor VG by the pair of embedded units 202*a*, 202*b*. Thus, in the present embodiment, there is no part having a locally deep potential, unlike the imaging element 100*b* according to the comparative example. Thus, the present embodiment, in which charges do not remain in a part where the potential is locally deep, can reduce occurrence of charge transfer failure such as returning of charges from the part to the photodiode PD (signal return, pumping) when the vertical transfer transistor VG is turned off.

In the present embodiment, the embedded units 202 are not limited to a rectangular shape on the plane illustrated in FIG. 7 (section obtained by cutting the imaging element 100 along a direction parallel to a surface of the semiconductor substrate 102), and they may be formed in a substantially elliptical shape, for example. Specifically, each embedded unit 202 may be formed in an elliptical shape having a long axis extending along a direction (arrow in FIG. 7) from the center O of the imaging element 100 toward the center of the floating diffusion region FD on the plane. Thus, also in this modification, the pair of embedded units 202 have a positional relationship of being parallel to each other.

Figure 9:
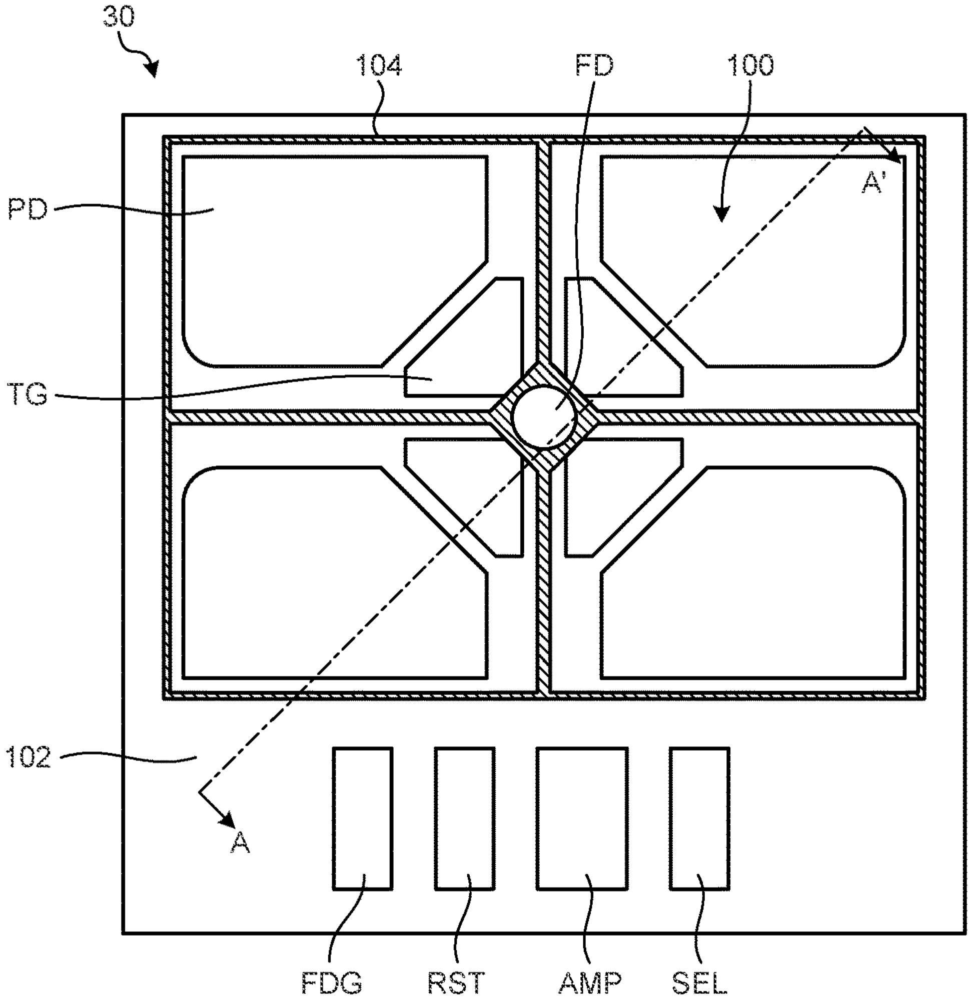
FIG. 9 is a schematic plan view of the imaging device 1 according to the first embodiment of the present disclosure.

The pixel region 30 of the imaging device 1 may be configured by using a plurality of the imaging elements 100 according to the present embodiment described above. Hereinafter, an example of a planar configuration of the imaging device 1, specifically, a part of the pixel region 30 of the imaging device 1 will be described with reference to FIG. 9. FIG. 9 is a schematic plan view of the imaging device 1 according to the present embodiment.

As illustrated in FIG. 9, in the pixel region 30 of the imaging device 1, four imaging elements 100 may be configured as one unit, for example. Specifically, in the example illustrated in FIG. 9, four imaging elements 100 are arranged in two rows×two columns, and these four imaging elements 100 share one floating diffusion region FD positioned at the center. Further, these four imaging elements 100 share one selection transistor SEL, one amplification transistor AMP, one reset transistor RST, and one conversion efficiency switching transistor FDG. In the present embodiment, the unit is not limited to the configuration of the four imaging elements 100 arranged in two rows×two columns but may be configured by the imaging elements 100 in a different number or arrangement from the example illustrated in FIG. 9.

Figure 10:
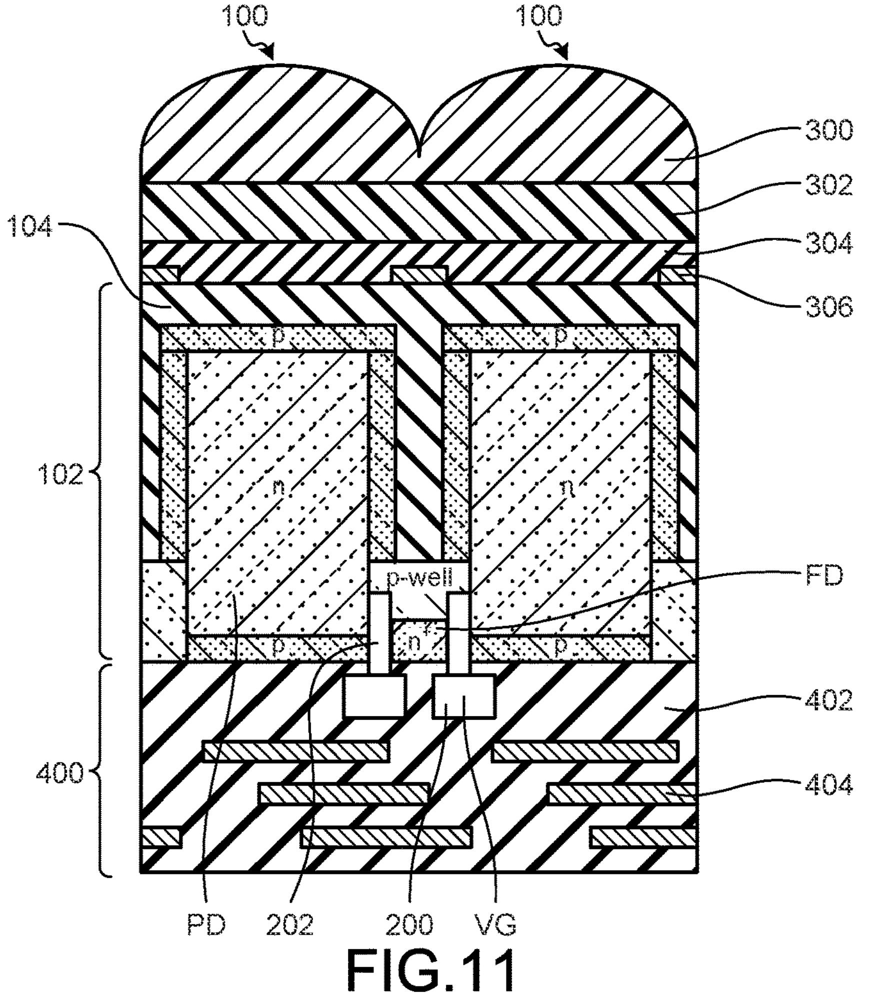
FIG. 10 is a schematic sectional view of the imaging device 1 according to the first embodiment of the present disclosure.

Next, an example of a sectional configuration of the imaging element 100 will be described with reference to FIG. 10. FIG. 10 is a schematic sectional view of the imaging device 1 according to the present embodiment. Specifically, it is a section of the imaging device 1 taken along the line A-A' in FIG. 9. In FIG. 10, the upper side of the drawing is the back surface side of the semiconductor substrate 102, and the lower side of the drawing is the front surface side of the semiconductor substrate 102.

As illustrated in FIG. 10, the imaging element 100 includes a p-type semiconductor substrate 102 formed of a silicon substrate or the like. The photodiode PD is formed in the semiconductor substrate 102 by forming an n-type semiconductor region and a p-type semiconductor region in the p-type semiconductor substrate 102.

Next, description will be given from the upper side of FIG. 10, that is, the back surface side of the semiconductor substrate 102. An on-chip lens 300 made of a styrene resin, an acrylic resin, a styrene-acrylic copolymer resin, a siloxane resin, or the like, on which reflected light from a subject is incident, is provided above the back surface of the semiconductor substrate 102. A planarization film 302 made of, for example, silicon oxide ($SiO_2$), silicon nitride (SiN), silicon oxynitride (SiON), or the like is provided below the on-chip lens 300. Further, an antireflection film 304 formed of an insulating film is provided below the planarization film 302. For example, the antireflection film 304 may be made of hafnium oxide ($HfO_2$), aluminum oxide ($Al_2O_3$), titanium oxide ($TiO_2$), silicon oxide, or the like, or it may be formed of a stack of these materials.

A light shielding film 306 for preventing reflected light from the subject from entering adjacent imaging elements 100 is provided on the back surface of the semiconductor substrate 102 and in a boundary region with adjacent imaging elements 100. The light shielding film 306 is made of a material that shields light. It may be formed by using, for example, a metal material such as tungsten (W), aluminum (Al), or copper (Cu).

In the semiconductor substrate 102 below the light shielding film 306, the pixel isolation unit 104 for preventing incident light from entering adjacent imaging elements 100 is provided. The pixel isolation unit 104 includes, for example, a trench (groove) provided in the semiconductor substrate 102 and an insulating film such as silicon oxide embedded in the trench.

Next, the lower side of FIG. 10, that is, the front surface side of the semiconductor substrate 102 will be described. Two vertical transfer transistors VG, which are vertical transistors, are formed to sandwich the floating diffusion region FD, which is an n-type semiconductor region provided in the semiconductor substrate 102. Specifically, each vertical transfer transistor VG has a gate electrode 200 formed of, for example, a polysilicon film provided on the surface of the semiconductor substrate 102 via an insulating film (not illustrated) having a film thickness of, for example, about several nm. The vertical transfer transistor VG further includes the embedded unit 202 formed of a polysilicon film embedded in the semiconductor substrate 102. The embedded unit 202 may be provided in a substantially rectangular shape in the section illustrated in FIG. 10 or may be provided in a tapered shape tapering from the bottom to the top or tapering from the top to the bottom. The embedded unit 202 is covered with an insulating film having a film thickness of, for example, about several nm, which is not illustrated in FIG. 10.

Further, a wiring layer 400 is provided on the surface of the semiconductor substrate 102. The wiring layer 400 includes an insulating film 402 made of silicon oxide, silicon nitride, silicon oxynitride, or the like, and a wiring 404 made of polysilicon, tungsten, aluminum, copper, or the like. Although not illustrated, a circuit including various transistors and the like may be formed in the wiring layer 400.

The sectional structure of the imaging element 100 according to the present embodiment is not limited to the example illustrated in FIG. 10 but may include, for example, other elements and the like, without particular limitation.

In this manner, in the present embodiment, the fin type vertical transfer transistor VG including a gate electrode having the pair of embedded units 202*a*, 202*b* embedded in the semiconductor substrate 102 is used. With this configuration, in the present embodiment, the potential can be modulated as desired to a deep region of the semiconductor substrate 102. Thus, the present embodiment can avoid generation of a potential peak (barrier) in the photodiode PD, in the vicinity of the transfer transistor TG, and the like, unlike the imaging element 100*a* according to the comparative example. Thus, the charges are smoothly transferred from the photodiode PD toward the diffusion region FD without being interrupted by the barrier. In addition, the present embodiment can eliminate local generation of a part having a deep potential, unlike the imaging element 100*b* according to the comparative example. Thus, the present embodiment, in which charges do not remain in a part where the potential is locally deep, can reduce occurrence of charge transfer failure such as returning of charges from the part to the photodiode PD (signal return, pumping) when the vertical transfer transistor VG is turned off. That is, according to the present embodiment, occurrence of charge transfer failure can be avoided.

5. Second Embodiment

Figure 11:
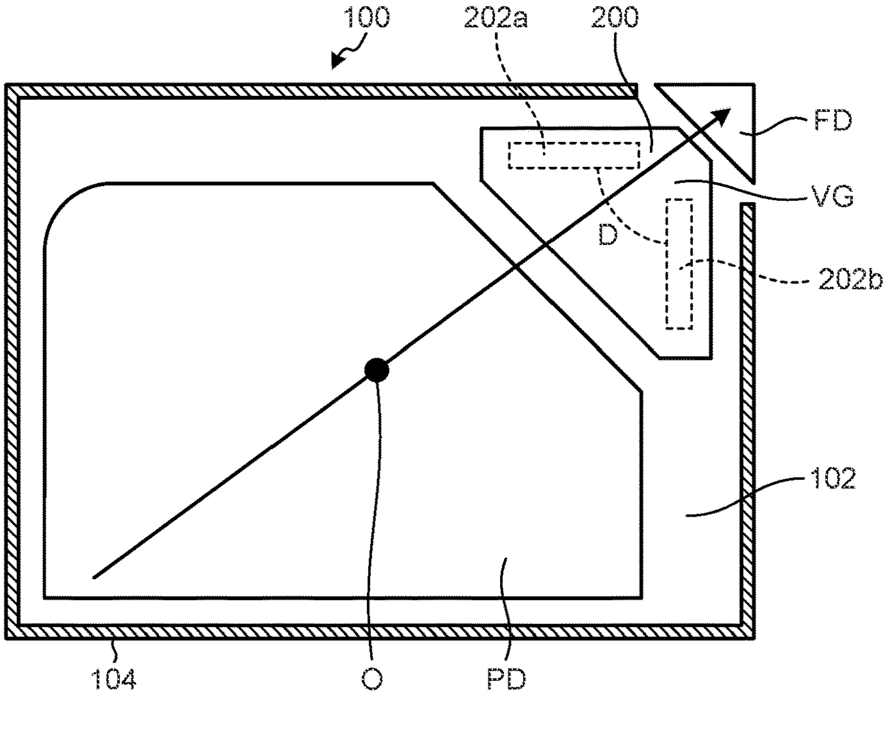
FIG. 11 is a schematic plan view of the imaging element 100 according to a second embodiment of the present disclosure.
Figure 12:
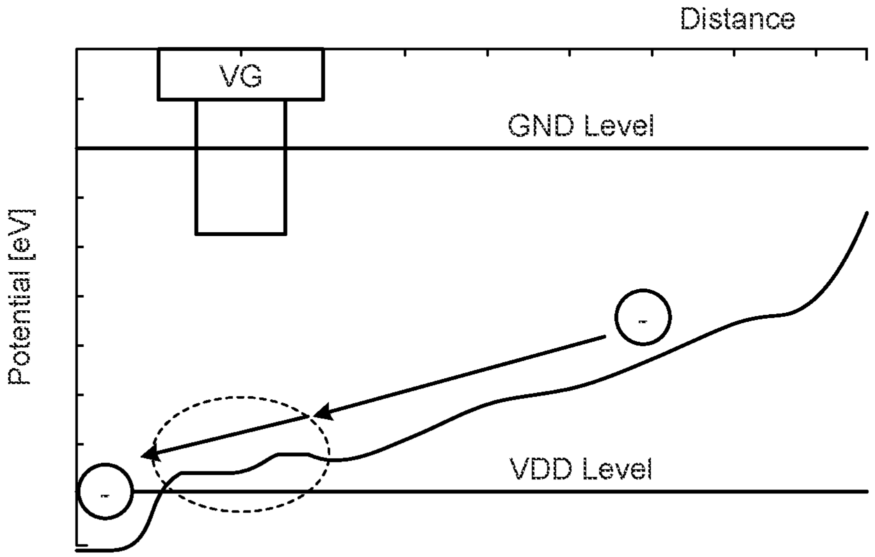
FIG. 12 is a graph illustrating a potential in the imaging element 100 according to the second embodiment of the present disclosure.

Next, the imaging element 100 according to a second embodiment of the present disclosure will be described with reference to FIGS. 11 and 12. FIG. 11 is a schematic plan view of the imaging element 100 according to the present embodiment. FIG. 12 is a graph illustrating a potential in the imaging element 100 according to the present embodiment.

In the first embodiment described above, the pair of embedded units 202*a*, 202*b* are provided to have a positional relationship of being parallel to each other on the plane illustrated in FIG. 7. In the second embodiment, the pair of embedded units 202*a*, 202*b* are provided to have a positional relationship of not being parallel to each other. The present embodiment, in which the embedded units 202*a*, 202*b* are provided in this manner, can generate a gradient of the potential toward the floating diffusion region FD in more suitable manner under the gate electrode 200 of the vertical transfer transistor VG and can further smooth the transfer of charges.

Specifically, as illustrated in FIG. 11, in the imaging element 100 according to the present embodiment, the vertical transfer transistor VG includes a flat-plate-like gate electrode 200 stacked on the semiconductor substrate 102 via an insulating film (not illustrated), and the pair of embedded units (first embedded gate units) 202*a*, 202*b* embedded in the semiconductor substrate 102, as in the first embodiment described above. In addition, in the present embodiment, each of the pair of embedded units 202*a*, 202*b* is provided in a rectangular shape on the plane illustrated in FIG. 11 (section obtained by cutting the imaging element 100 along a direction parallel to a surface of the semiconductor substrate 102), as in the first embodiment described above.

Further, in the present embodiment, in the plane illustrated in FIG. 11, the pair of embedded units 202*a*, 202*b* are provided such that the distance between one embedded unit 202*a* and the other embedded unit 202*b* gradually increases along a direction extending along a direction (arrow in FIG. 11) from the center O of the imaging element 100 toward the center of the floating diffusion region FD. In the present embodiment, an angle D formed by one embedded unit 202*a* and the other embedded unit 202*b* may be 45 to 120 degrees on the plane. The angle may be appropriately selected such that a desired region in the semiconductor substrate 102 has a desired potential. That is, in the present embodiment, the angle D formed by one embedded unit 202*a* and the other embedded unit 202*b* may be appropriately adjusted according to the range and depth in which the potential is desired to be modulated and the gradient of the desired potential.

FIG. 12 is a computer simulation of a potential in the semiconductor substrate 102 in the imaging element 100, illustrating the distance from the photodiode PD toward the floating diffusion region FD along the arrow in FIG. 11 from right to left in FIG. 12. In the present embodiment, the potential in the semiconductor substrate 102 is modulated as illustrated in FIG. 12 by applying a predetermined voltage to the gate electrode 200 of the vertical transfer transistor VG. The modulated potential has a gradient descending from the photodiode PD (right end in FIG. 12) toward the floating diffusion region FD (left end in FIG. 12). Thus, the charges generated in the photodiode PD are transferred toward the floating diffusion region FD according to the gradient.

Further, in the present embodiment, as illustrated in FIG. 12, in the semiconductor substrate 102 under the gate electrode 200 of the vertical transfer transistor VG, the gradient of the potential descending to the left toward the floating diffusion region FD can be more suitably created. Thus, the present embodiment can further smooth the charge transfer.

6. Third Embodiment

Figure 13:
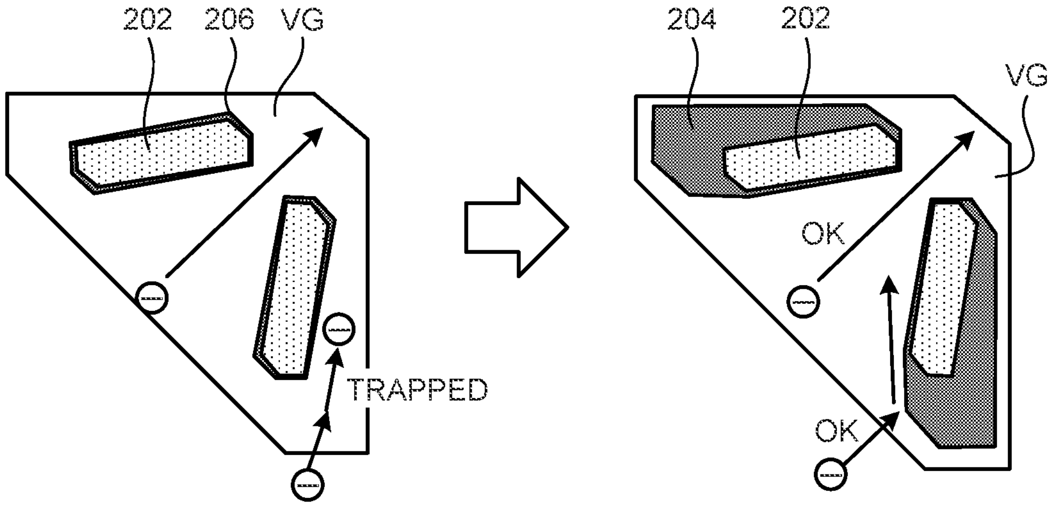
FIG. 13 is an explanatory diagram for explaining a third embodiment of the present disclosure.

First, the background leading to the creation of a third embodiment of the present disclosure by the inventors of the present disclosure will be described with reference to FIG. 13. FIG. 13 is an explanatory diagram for explaining the present embodiment.

The vertical transfer transistor VG according to the second embodiment described above is illustrated on the left side of FIG. 13. In the second embodiment, each of the pair of embedded units 202 is covered with an insulating film (first oxide film) 206 made of silicon oxide or the like and having a film thickness of, for example, about several nm, and is provided such that the distance between one embedded unit 202 and the other embedded unit 202 gradually increases along the direction from the center O of the imaging element 100 toward the center of the floating diffusion region FD. In such a structure, since the potential between the pair of embedded units 202 is suitably modulated by the pair of embedded units 202, the charges passing between the pair of embedded units 202 can be smoothly transferred to the floating diffusion region FD. However, in such a structure, charges passing through the outer sides of the pair of embedded units 202 may be trapped, and transfer to the floating diffusion region FD may become difficult.

Accordingly, the inventors of the present disclosure have conceived of adding an element that functions as charge trap prevention on the outer sides of the embedded units 202 to prevent the charges from being trapped on the outer sides of the pair of embedded units 202. As such an element, for example, it is conceivable to provide a p-well having a p-type conductivity type on the outer sides of the pair of embedded units 202. Providing such an element prevents charges from passing through the outer sides of the embedded units 202, and thus it is possible to prevent charges from being trapped on the outer sides of the embedded units 202. However, as a result of repeated studies by the inventors, it has been found that when a p-well is used, parasitic capacitance parasitic in the gate electrode 200 of the vertical transfer transistor VG greatly increases. Then, even when a predetermined voltage is applied to the gate electrode 200 of the vertical transfer transistor VG at the time of transfer of charges, such a large parasitic capacitance causes the signal waveform of the applied voltage to be rounded, and the potential in the semiconductor substrate 102 cannot be smoothly modulated. Thus, when a p-well is used as an element that functions as charge trap prevention, transfer failure or transfer deterioration occurs, for example, charges cannot be transferred, or the transfer becomes difficult.

In the embodiment of the present disclosure described so far, the transfer transistor TG of the flat plate type is changed to the vertical transfer transistor VG, and the pair of embedded units 202*a*, 202*b* are provided. Thus, the contact area between the gate electrode 200 including the embedded units 202 and the semiconductor substrate 102 is increased via the insulating film (not illustrated), and the parasitic capacitance parasitic on the gate electrode 200 of the vertical transfer transistor VG greatly increases. Even when a predetermined voltage is applied to the gate electrode 200 of the vertical transfer transistor VG at the time of transfer of charges, such a large parasitic capacitance causes the signal waveform of the applied voltage to be rounded, and the potential in the semiconductor substrate 102 cannot be smoothly modulated, leading to occurrence of transfer deterioration.

To solve the problem, the inventors of the present disclosure have conceived of forming an element functioning as trap prevention on the outer side of the embedded unit 202 on the outer sides of the pair of embedded units 202 by using an oxide film such as a silicon oxide film. Using an oxide film such as a silicon oxide film can hold down the parasitic capacitance as compared with the case of using a p-well (silicon), because of the relationship of relative permittivity.

Specifically, as illustrated on the right side of FIG. 13, out of the side surfaces of each embedded unit 202, the side surface positioned on the opposite side of the side surface facing the other embedded unit 202 is covered with an insulating film (second oxide film) 204 thicker than the insulating film covering the facing side surface (first oxide film, having a film thickness of about 2 nm to 15 nm, for example). For example, the insulating film 204 has a thickness of about several 100 nm. More specifically, the insulating film 204 is preferably provided to spread between the embedded units 202 and the pixel isolation unit 104 to prevent charges from passing through the outer sides of the embedded units 202. In the present embodiment, the insulating film 204 having a large thickness is formed of an oxide film such as a silicon oxide film to hold down the parasitic capacitance. With this configuration, the present embodiment can avoid charges from being trapped on the outer sides of the embedded units 202 while avoiding an increase in parasitic capacitance. In the present embodiment, the thick insulating film 204 preferably covers the side surface of each embedded unit 202 facing the photodiode PD. With this configuration, it is possible to prevent charges from being trapped on the side surface of the embedded unit 202 facing the photodiode PD, and charges can be smoothly transferred to the floating diffusion region FD.

Figure 14:
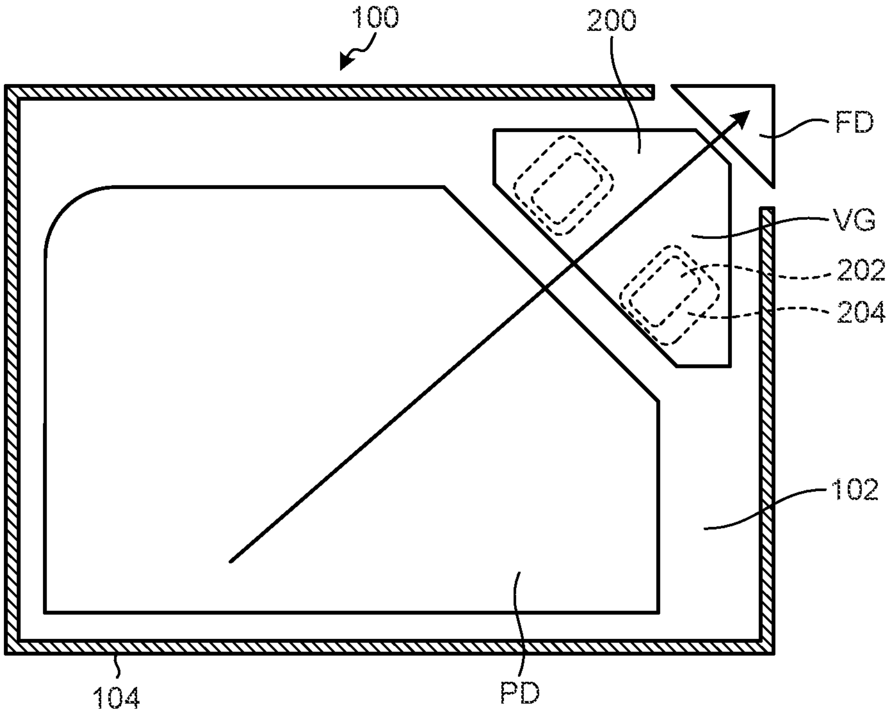
FIG. 14 is a schematic plan view of the imaging element 100 according to the third embodiment of the present disclosure.
Figure 15:
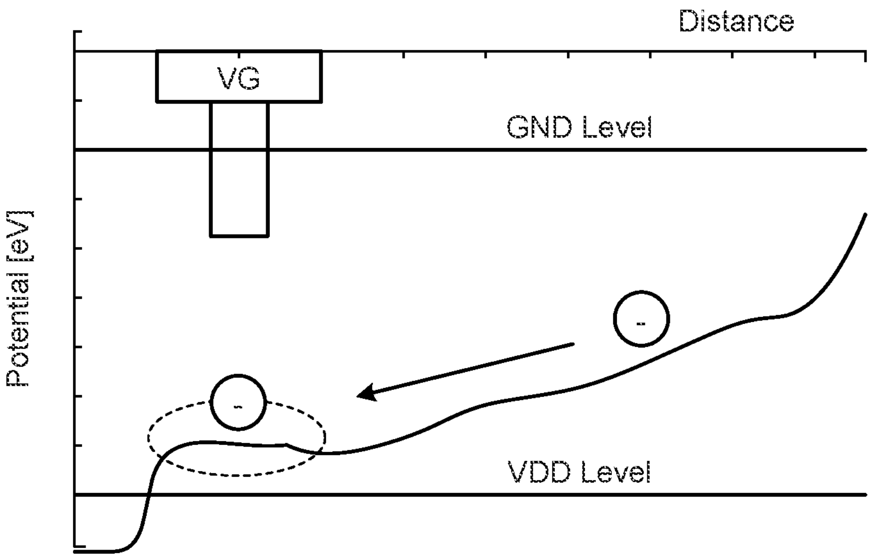
FIG. 15 is a graph illustrating a potential in the imaging element 100 according to the third embodiment of the present disclosure.

Next, the imaging element 100 according to the third embodiment of the present disclosure will be described with reference to FIGS. 14 and 15. FIG. 14 is a schematic plan view of the imaging element 100 according to the present embodiment. FIG. 15 is a graph illustrating a potential in the imaging element 100 according to the present embodiment.

Specifically, as illustrated in FIG. 14, in the imaging element 100 according to the present embodiment, the vertical transfer transistor VG includes the flat-plate-like gate electrode 200 stacked on the semiconductor substrate 102 via an insulating film (not illustrated), and the pair of embedded units (first embedded gate unit) 202 embedded in the semiconductor substrate 102. Each embedded unit 202 has the insulating film 204 covering a side surface opposite to a side surface facing the other embedded unit 202. The insulating film 204 is, for example, 10 times to 20 times or more thicker (for example, the film thickness is about 100 nm) than the insulating film (for example, the film thickness is about several nm) covering the side surface facing the other embedded unit 202. With this configuration, the insulating film 204 is provided to spread between the embedded units 202 and the pixel isolation unit 104, and charges cannot pass through the outer sides of the embedded units 202. In the present embodiment, the insulating film 204 having a large thickness is formed of an oxide film such as a silicon oxide film to hold down the parasitic capacitance. With this configuration, the present embodiment can avoid charges from being trapped on the outer sides of the embedded units 202 while avoiding an increase in parasitic capacitance.

FIG. 15 is a computer simulation of a potential in the semiconductor substrate 102 in the imaging element 100, illustrating the distance from the photodiode PD toward the floating diffusion region FD along the arrow in FIG. 14 from right to left in FIG. 15. In the present embodiment, the potential in the semiconductor substrate 102 is modulated as illustrated in FIG. 15 by applying a predetermined voltage to the gate electrode 200 of the vertical transfer transistor VG. The modulated potential has a gradient descending from the photodiode PD (right end in FIG. 15) toward the floating diffusion region FD (left end in FIG. 15). Thus, the charges generated in the photodiode PD are transferred toward the floating diffusion region FD according to the gradient.

Figure 16:
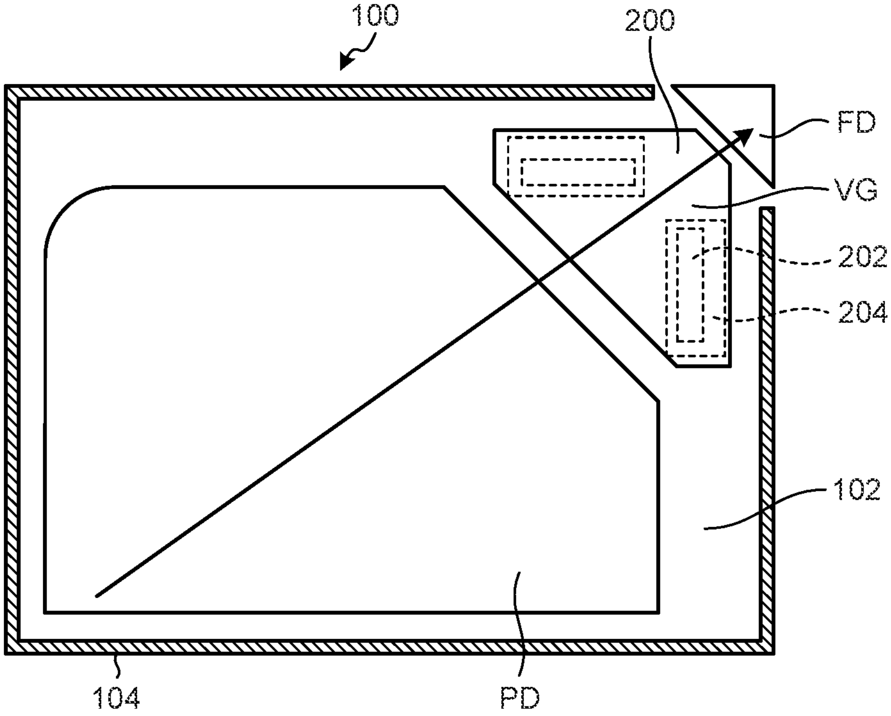
FIG. 16 is a schematic plan view of the imaging element 100 according to a modification of the third embodiment of the present disclosure.
Figure 17:
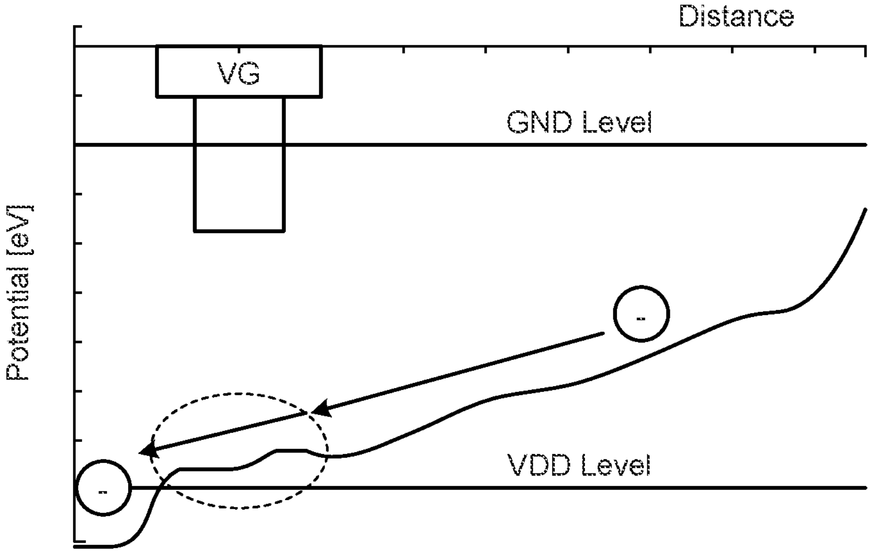
FIG. 17 is a graph illustrating a potential in the imaging element 100 according to the modification of the third embodiment of the present disclosure.

Next, the imaging element 100 according to a modification of the third embodiment of the present disclosure will be described with reference to FIGS. 16 and 17. FIG. 16 is a schematic plan view of the imaging element 100 according to the modification of the present embodiment. FIG. 17 is a graph illustrating a potential in the imaging element 100 according to the modification of the present embodiment.

Specifically, as illustrated in FIG. 16, in the imaging element 100 according to the present embodiment, the insulating film 204 according to the present embodiment is provided with respect to the configuration of the second embodiment described above. With this configuration, the present modification can avoid charges from being trapped on the outer sides of the embedded units 202 while avoiding an increase in parasitic capacitance.

FIG. 17 is a computer simulation of a potential in the semiconductor substrate 102 in the imaging element 100, illustrating the distance from the photodiode PD toward the floating diffusion region FD along the arrow in FIG. 16 from right to left in FIG. 17. In the present embodiment, the potential in the semiconductor substrate 102 is modulated as illustrated in FIG. 17 by applying a predetermined voltage to the gate electrode 200 of the vertical transfer transistor VG. The modulated potential has a gradient descending from the photodiode PD (right end in FIG. 17) toward the floating diffusion region FD (left end in FIG. 17). Thus, the charges generated in the photodiode PD are transferred toward the floating diffusion region FD according to the gradient.

7. Fourth Embodiment

Figure 18:
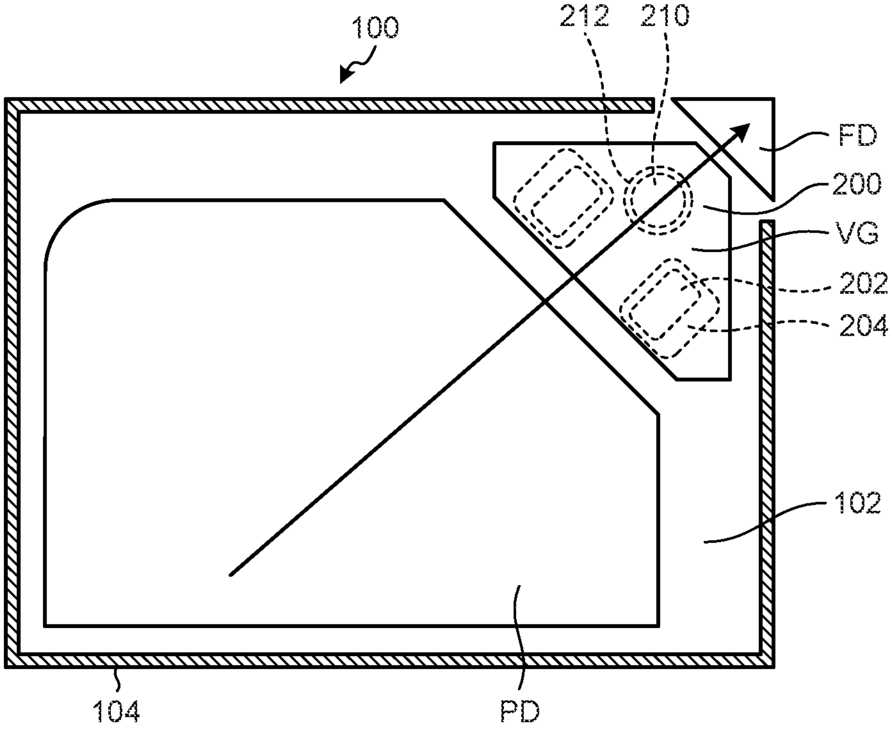
FIG. 18 is a schematic plan view of the imaging element 100 according to a fourth embodiment of the present disclosure.
Figure 19:
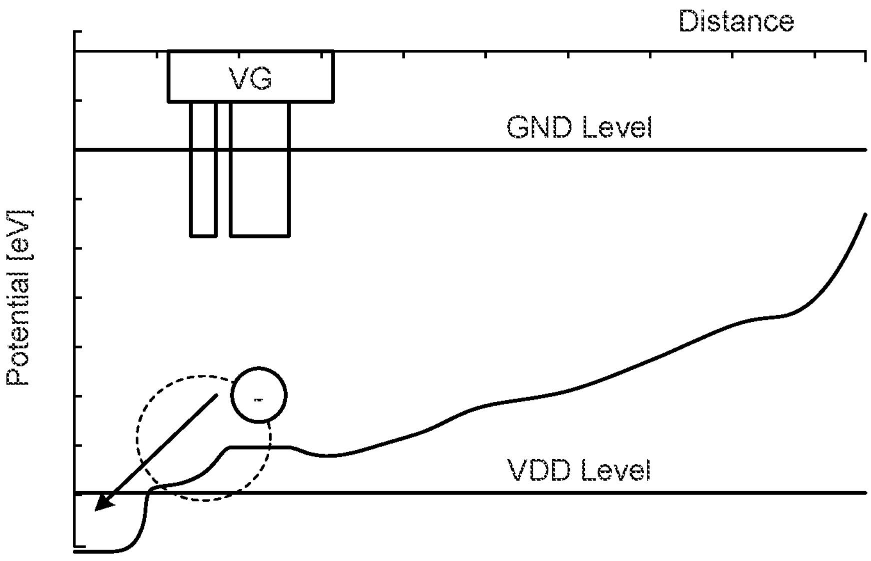
FIG. 19 is a graph illustrating a potential in the imaging element 100 according to the fourth embodiment of the present disclosure.

In the present embodiment, an embedded unit 210 is further provided in the configuration of the third embodiment described above, with which it is possible to more suitably modulate the potential and more smoothly transfer charges. The imaging element 100 according to a fourth embodiment of the present disclosure will be described with reference to FIGS. 18 and 19. FIG. 18 is a schematic plan view of the imaging element 100 according to the present embodiment. FIG. 19 is a graph illustrating a potential in the imaging element 100 according to the present embodiment.

Specifically, as illustrated in FIG. 18, in the present embodiment, the embedded unit (second embedded gate unit) 210 is further provided between the pair of embedded units (first gate embedded gate units) 202 according to the configuration of the third embodiment described above. The embedded unit 210 is provided in a substantially circular shape on a plane (section of the imaging element 100 cut along a direction parallel to a surface of the semiconductor substrate 102) illustrated in FIG. 18. An insulating film (third oxide film) 212 (for example, the film thickness is about 2 nm to 15 nm) made of silicon oxide ($SiO_2$) or the like, which is not illustrated, is provided between the embedded unit 210 and the semiconductor substrate 102. In other words, the embedded unit 210 is covered with the insulating film. Further, in the present embodiment, in the plane of FIG. 18, the embedded unit 210 is positioned closer to the floating diffusion region FD than each center of the embedded units 202. With this configuration, the potential in the vicinity of the floating diffusion region FD is more suitably modulated by the embedded unit 210.

FIG. 19 is a computer simulation of a potential in the semiconductor substrate 102 in the imaging element 100, illustrating the distance from the photodiode PD toward the floating diffusion region FD along the arrow in FIG. 18 from right to left in FIG. 19. In the present embodiment, the potential in the semiconductor substrate 102 is modulated as illustrated in FIG. 19 by applying a predetermined voltage to the gate electrode 200 of the vertical transfer transistor VG. The modulated potential has a gradient descending from the photodiode PD (right end in FIG. 19) toward the floating diffusion region FD (left end in FIG. 19). Thus, the charges generated in the photodiode PD are transferred toward the floating diffusion region FD according to the gradient.

Further, in the present embodiment, as illustrated in FIG. 19, the potential becomes deeper substantially uniformly in the entire semiconductor substrate 102 below the gate electrode 200 of the vertical transfer transistor VG by the pair of embedded units 202. In addition, in the present embodiment, as illustrated in FIG. 19, the potential in the vicinity of the floating diffusion region FD is more suitably deepened by the embedded unit 210, and charges can be more smoothly transferred.

Figure 20:
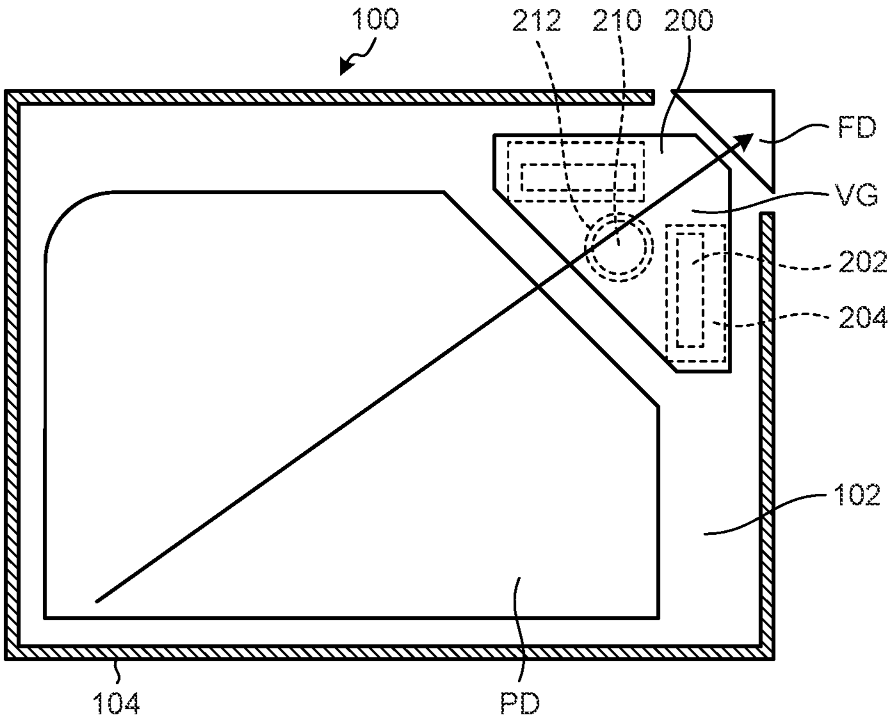
FIG. 20 is a schematic plan view of the imaging element 100 according to a modification of the fourth embodiment of the present disclosure.
Figure 21:
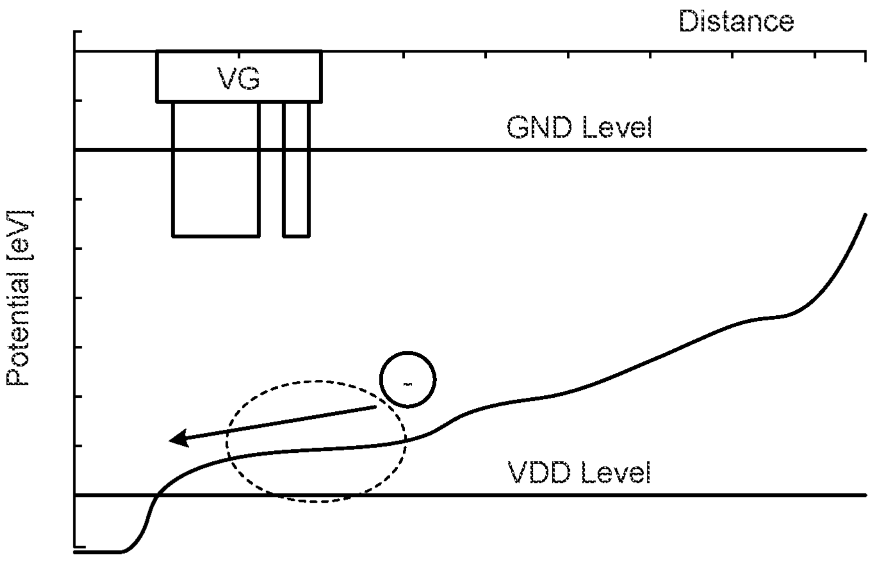
FIG. 21 is a graph illustrating a potential in the imaging element 100 according to the modification of the fourth embodiment of the present disclosure.

Next, the imaging element 100 according to a modification of the fourth embodiment of the present disclosure will be described with reference to FIGS. 20 and 21. FIG. 20 is a schematic plan view of the imaging element 100 according to the modification of the present embodiment. FIG. 21 is a graph illustrating a potential in the imaging element 100 according to the modification of the present embodiment.

Specifically, as illustrated in FIG. 20, in the imaging element 100 according to the modification of the present embodiment, the embedded unit 210 is positioned farther from the floating diffusion region FD than each center of the embedded units 202 in the plane illustrated in FIG. 20, unlike the present embodiment described above. With this configuration, generation of a potential barrier in the vicinity of the photodiode PD can be reduced, the potential in the vicinity of the photodiode PD becomes deeper in a more suitable manner, and charges can be transferred more smoothly.

FIG. 21 is a computer simulation of a potential in the semiconductor substrate 102 in the imaging element 100, illustrating the distance from the photodiode PD toward the floating diffusion region FD along the arrow in FIG. 20 from right to left in FIG. 21. In the present modification, as illustrated in FIG. 21, the potential is deepened substantially uniformly in the entire semiconductor substrate 102 below the gate electrode 200 of the vertical transfer transistor VG by the pair of embedded units 202. In addition, in the present modification, as illustrated in FIG. 21, generation of a potential barrier in the vicinity of the photodiode PD can be reduced by the embedded unit 210, the potential in the vicinity of the photodiode PD becomes deeper in a more suitable manner, and charges can be transferred more smoothly.

8. Fifth Embodiment

In the present disclosure, by variously changing the shape of the embedded units 202, the potential in the semiconductor substrate 102 can be more suitably modulated, occurrence of charge transfer failure can be further reduced, and furthermore, charges can be more smoothly transferred. For example, in a fifth embodiment of the present disclosure described below, the electric field under the gate electrode 200 of the vertical transfer transistor VG can be made uniform, and the transfer of charges can be further improved by bending the embedded units 202 to have an arcuate shape.

Figure 22:
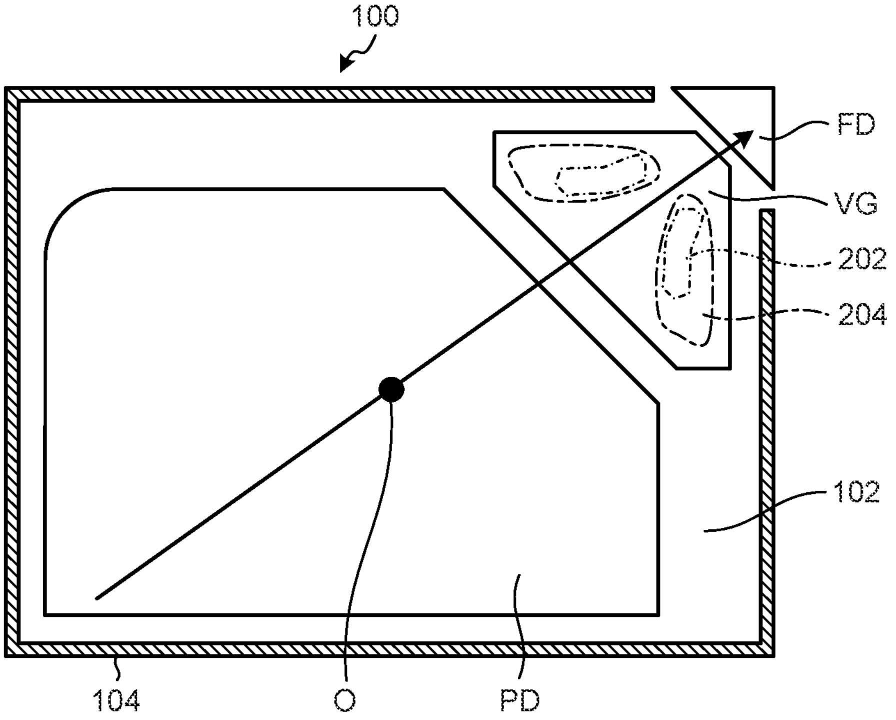
FIG. 22 is a schematic plan view of the imaging element 100 according to a fifth embodiment of the present disclosure.
Figure 23:
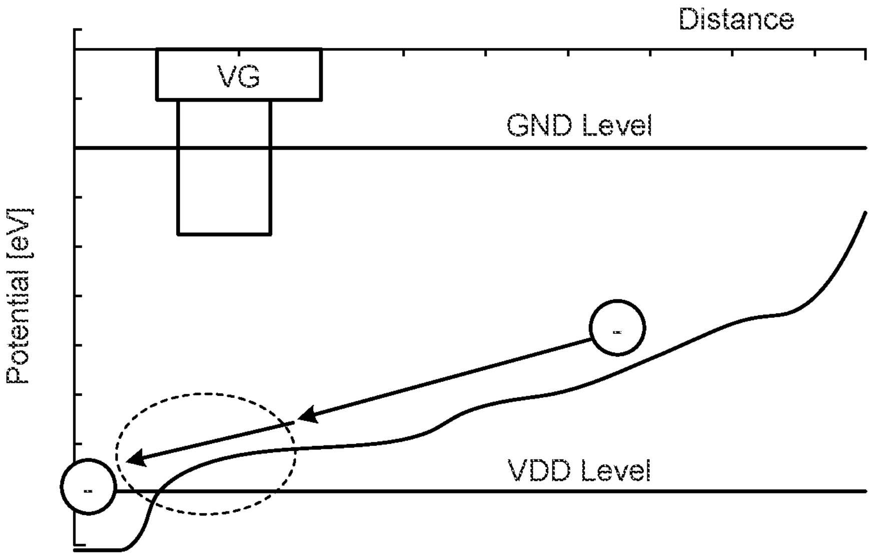
FIG. 23 is a graph illustrating a potential in the imaging element 100 according to the fifth embodiment of the present disclosure.

The imaging element 100 according to the fifth embodiment of the present disclosure will be described with reference to FIGS. 22 and 23. FIG. 22 is a schematic plan view of the imaging element 100 according to the present embodiment. FIG. 23 is a graph illustrating a potential in the imaging element 100 according to the present embodiment.

Specifically, as illustrated in FIG. 22, in the imaging element 100 according to the present embodiment, the vertical transfer transistor VG includes the flat-plate-like gate electrode 200 stacked on the semiconductor substrate 102 via an insulating film (not illustrated), and the pair of embedded units (first embedded gate units) 202 embedded in the semiconductor substrate 102. Each of the pair of embedded units 202 is provided such that the center line thereof draws an arc on the plane illustrated in FIG. 22 (section obtained by cutting the imaging element 100 along a direction parallel to a surface of the semiconductor substrate 102). Further, in the present embodiment, in the plane illustrated in FIG. 22, the pair of embedded units 202 are provided such that the distance between one embedded unit 202 and the other embedded unit 202 gradually increases along a direction extending along a direction (arrow in FIG. 22) from the center O of the imaging element 100 toward the center of the floating diffusion region FD. In the present embodiment, the embedded units 202 are not limited to the shape as illustrated in FIG. 22 but may be changed to various shapes to obtain a desired modulation of potential.

FIG. 23 is a computer simulation of a potential in the semiconductor substrate 102 in the imaging element 100, illustrating the distance from the photodiode PD toward the floating diffusion region FD along the arrow in FIG. 22 from right to left in FIG. 23. In the present embodiment, the potential in the semiconductor substrate 102 is modulated as illustrated in FIG. 23 by applying a predetermined voltage to the gate electrode 200 of the vertical transfer transistor VG. The modulated potential has a gradient descending from the photodiode PD (right end in FIG. 23) toward the floating diffusion region FD (left end in FIG. 23). Thus, the charges generated in the photodiode PD are transferred toward the floating diffusion region FD according to the gradient. In the present embodiment, as illustrated in FIG. 23, the potential becomes deeper substantially uniformly below the gate electrode 200 of the vertical transfer transistor VG by the pair of embedded units 202, and transfer of charges can be further improved.

9. Sixth Embodiment

Figure 24:
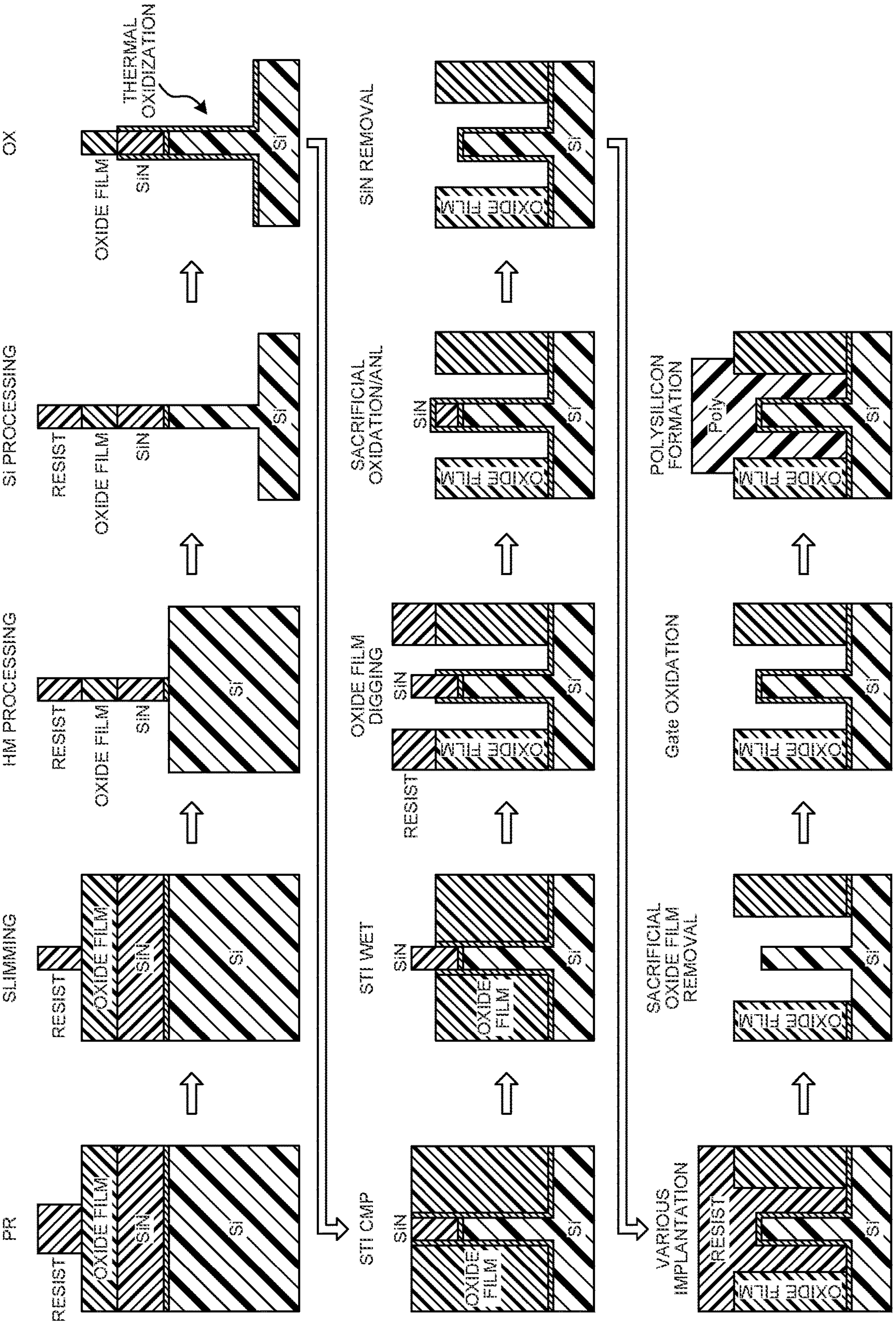
FIG. 24 is a schematic diagram for explaining a method for manufacturing the imaging element 100 according to a sixth embodiment of the present disclosure.

Next, a method for manufacturing the imaging element 100 according to the present embodiment will be described with reference to FIG. 24. FIG. 24 is a schematic diagram for explaining the method for manufacturing the imaging element 100 according to the present embodiment, and specifically, each drawing is a sectional view of the gate electrode 200 and the embedded units 202 of the vertical transfer transistor VG of the imaging element 100 at each stage in the manufacturing process. In these drawings, the lower side of the drawing is the back surface side of the semiconductor substrate 102, and the upper side of the drawing is the front surface side of the semiconductor substrate 102.

In the manufacturing process illustrated in FIG. 24, the embedded units 202 are formed at the same time as the pixel isolation unit 104. Thus, the depth of the trench of the pixel isolation unit 104 and the depth of the embedded units 202 can be made the same, and the number of steps and defects due to trench formation can be held down.

As illustrated in the upper left side of FIG. 24, sequentially stack an oxide film, a silicon nitride (SiN) film, and an oxide film on the semiconductor substrate 102 composed of a silicon substrate and form a photoresist having a desired pattern thereon. Next, as illustrated in the second diagram from the left side in the upper part of FIG. 24, process the resist to be thin (slimming). Then, as illustrated in the third diagram from the left side of the upper part of FIG. 24, process an oxide film, a silicon nitride (SiN) film, and an oxide film according to the shape of the thinned resist to form a hard mask (HM).

Next, as illustrated in the fourth diagram from the left side of the upper part of FIG. 24, perform dry etching on the semiconductor substrate according to the shape of the hard mask to form a trench. Further, as illustrated in the fifth diagram from the left side of the upper part of FIG. 24, thermally oxidize the surface by applying heat after removing the resist. Next, as illustrated on the left side of the middle part of FIG. 24, after the oxide film on the surface is removed, embed the oxide film in the trench, and planarize the surface by a chemical mechanical polishing (CMP) method. Then, as illustrated in the second diagram from the left side of the middle part of FIG. 24, perform wet etching on the surface of the oxide film embedded in the trench.

Next, as illustrated in the third diagram from the left side of the middle part of FIG. 24, form a photoresist having a desired pattern and dig the oxide film according to the shape of the resist to form a trench. Further, as illustrated in the fourth diagram from the left side of the middle part of FIG. 24, perform sacrificial oxidation on the surface of the silicon nitride (SiN) film by annealing after the resist is removed.

Next, as illustrated in the fifth diagram from the left side of the middle part of FIG. 24, remove the silicon nitride (SiN) film. Then, as illustrated in the lower left part of FIG. 24, after a resist is formed to embed the trench or the like, implant various ions into the semiconductor substrate. Next, as illustrated in the second diagram from the left side of the lower part of FIG. 24, remove the resist and the sacrificial oxide film. Further, as illustrated in the third diagram from the left side of the lower part of FIG. 24, after the surface of the trench is oxidized, embed polysilicon in the trench to form the embedded units 202 as illustrated in the fourth diagram from the left side of the lower part of FIG. 24.

In this manner, the imaging element 100 according to the embodiment of the present disclosure can be easily and inexpensively manufactured using an existing semiconductor device manufacturing process.

Figure 25:
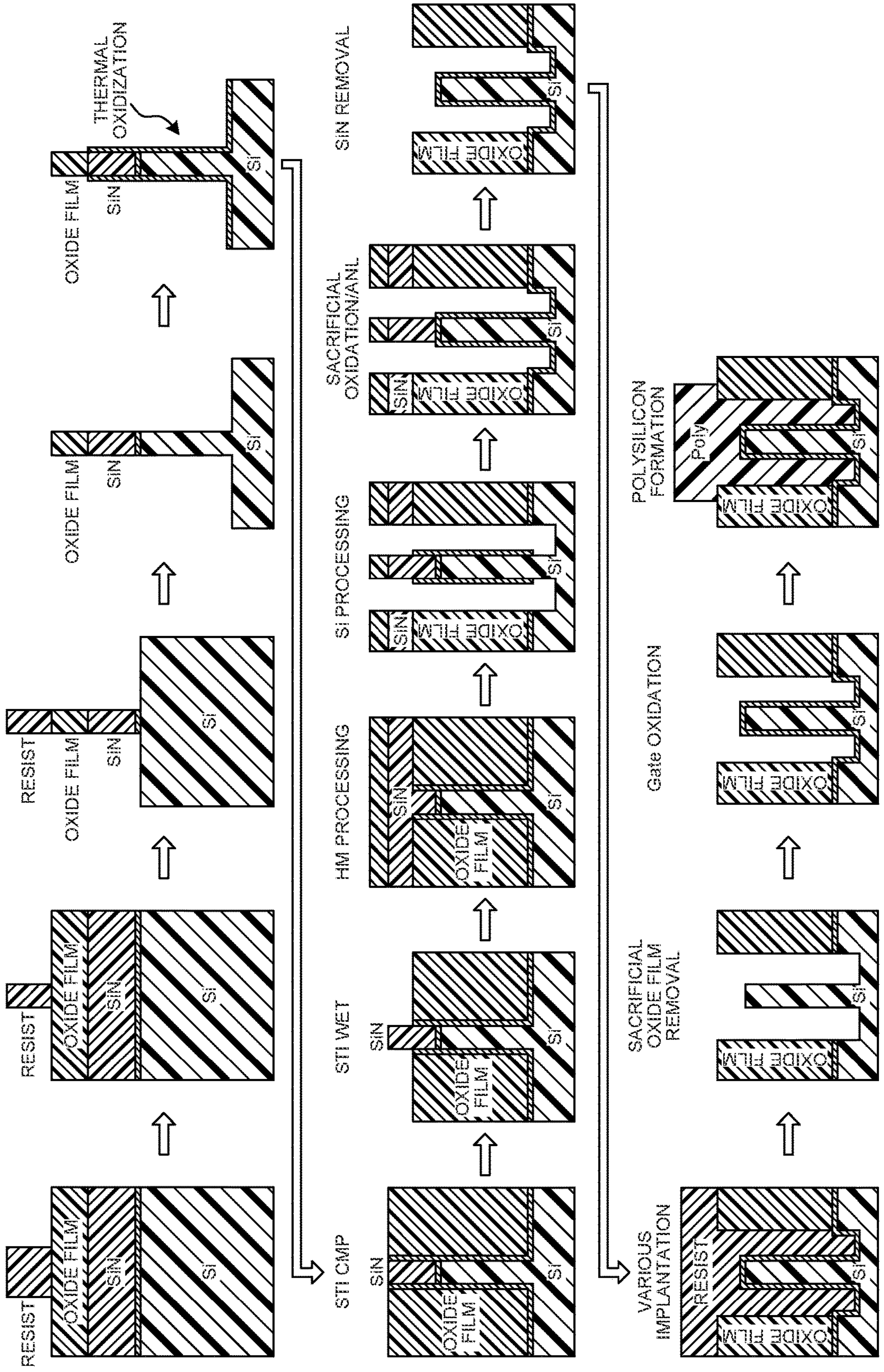
FIG. 25 is a schematic diagram for explaining a method for manufacturing the imaging element 100 according to a modification of the sixth embodiment of the present disclosure.

Further, a manufacturing process as illustrated in FIG. 25 may also be applied. FIG. 25 is a schematic diagram for explaining a method for manufacturing the imaging element 100 according to a modification of the present embodiment, and specifically, each drawing is a sectional view of the gate electrode 200 and the embedded units 202 of the vertical transfer transistor VG of the imaging element 100 at each stage in the manufacturing process. In these drawings, the lower side of the drawing is the back surface side of the semiconductor substrate 102, and the upper side of the drawing is the front surface side of the semiconductor substrate 102.

In the manufacturing process illustrated in FIG. 25, the embedded units 202 are formed separately from the pixel isolation unit 104. Thus, the depth of the embedded units 202 can be made deeper than the depth of the trench of the pixel isolation unit 104. With this configuration, the embedded units 202 can modulate the potential at a deeper region of the semiconductor substrate 102. In particular, in the imaging element 100 that detects infrared light, it is preferable to make the depth of the embedded units 202 deeper because the infrared light is absorbed in a deep region of the semiconductor substrate 102. The manufacturing process illustrated in FIG. 25 has many points in common with the manufacturing process illustrated in FIG. 24, and thus a detailed description thereof is omitted here.

10. Conclusion

As described above, in the embodiment of the present disclosure, the fin type vertical transfer transistor VG having the gate electrode having the pair of embedded units 202*a*, 202*b* embedded in the semiconductor substrate 102 is used. With this configuration, in the present embodiment, the potential can be modulated as desired to a deep region of the semiconductor substrate 102. Thus, the present embodiment can avoid generation of a potential peak (barrier) in the photodiode PD, in the vicinity of the transfer transistor TG, and the like. Thus, the charges are smoothly transferred from the photodiode PD toward the diffusion region FD without being interrupted by the barrier. In addition, the present embodiment can eliminate local generation of a part having a deep potential. Thus, the present embodiment, in which charges do not remain in a part where the potential is locally deep, can reduce occurrence of charge transfer failure such as returning of charges from the part to the photodiode PD (signal return, pumping) when the vertical transfer transistor VG is turned off. That is, according to the present embodiment, occurrence of charge transfer failure can be avoided.

Although the present disclosure has been described above with reference to a plurality of embodiments, the present disclosure is not limited to the above embodiments and the like, but various modifications and combinations can be made.

In the embodiments of the present disclosure described above, the conductivity type of each semiconductor region described above may be reversed, and for example, the present embodiment can be applied to an imaging element using holes as charges instead of electrons.

In the embodiments of the present disclosure described above, the semiconductor substrate 102 is not necessarily a silicon substrate, and it may be another substrate (for example, a silicon on insulator (SOI) substrate, a SiGe substrate, or the like). In the semiconductor substrate 102, a semiconductor structure or the like may be formed in such various substrates.

Further, the imaging device 1 according to the embodiments of the present disclosure is not limited to an imaging device that captures a distribution of the amount of incident light of visible light as a detected image. For example, the present embodiment may be applied to an imaging device that captures a distribution of incident amounts of infrared rays, X-rays, particles, or the like as an image, or an imaging device (physical amount distribution detection device) such as a fingerprint detection sensor that detects a distribution of other physical amounts such as pressure and capacitance and captures the distribution as an image. The embodiments of the present disclosure are applied not only to the imaging device 1 but may also be applied to various semiconductor devices used in other applications.

In the embodiments of the present disclosure, examples of a method for forming each layer, each film, each element, and the like described above include a physical vapor deposition (PVD) method, a chemical vapor deposition (CVD) method, and the like. Examples of the PVD method include a vacuum vapor deposition method using resistance heating or high frequency heating, an electron beam (EB) vapor deposition method, various sputtering methods (magnetron sputtering method, radio frequency (RF)-direct current (DC) coupled bias sputtering method, electron cyclotron resonance (ECR) sputtering method, counter target sputtering method, high frequency sputtering method, and the like), an ion plating method, a laser ablation method, a molecular beam epitaxy (MBE) method, and a laser transfer method. Examples of the CVD method include a plasma CVD method, a thermal CVD method, a metal organic (MO) CVD method, and a photo CVD method. Further, other methods include electrolytic plating methods, electroless plating methods, spin coating methods; immersion methods; cast methods; micro-contact printing; drop cast methods; various printing methods such as a screen printing method, an inkjet printing method, an offset printing method, a gravure printing method, or a flexographic printing method; stamping methods; spray methods; various coating methods such as an air doctor coater method, a blade coater method, a rod coater method, a knife coater method, a squeeze coater method, a reverse roll coater method, a transfer roll coater method, a gravure coater method, a kiss coater method, a cast coater method, a spray coater method, a slit orifice coater method, and a calender coater method. Examples of a patterning method of each layer include chemical etching such as shadow mask, laser transfer, or photolithography, and physical etching using ultraviolet rays, laser, or the like. Examples of planarization technique include a chemical mechanical polishing (CMP) method, a laser planarization method, and a reflow method. That is, the imaging element 100 according to the embodiments of the present disclosure can be easily and inexpensively manufactured using an existing semiconductor device manufacturing process.

11. Configuration Example of Electronic Device

The imaging device 1 as described above may be applied to various electronic devices such as an imaging system, for example, a digital still camera or a digital video camera, a mobile phone having an imaging function, or another device having an imaging function, for example.

Figure 26:
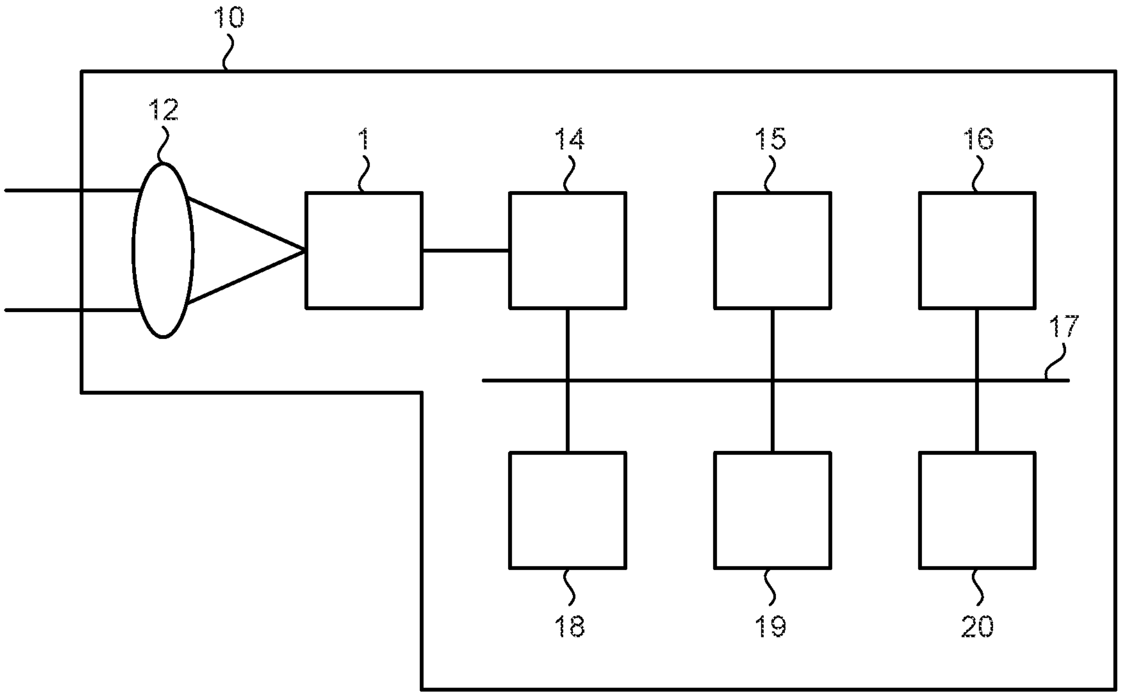
FIG. 26 is a block diagram illustrating a configuration example of an electronic device 10 on which the imaging device 1 is mounted.

FIG. 26 is a block diagram illustrating a configuration example of the electronic device on which the imaging device 1 is mounted.

As illustrated in FIG. 26, the electronic device 10 includes an optical system 12, an imaging device 1, and a digital signal processor (DSP) 14. The DSP 14, a display device 15, an operation system 16, a memory 18, a recording device 19, and a power supply system 20 are connected via a bus 17, and can capture a still image and a moving image.

The optical system 12 includes one or a plurality of lenses, guides image light (incident light) from a subject to the imaging device 1, and forms an image on a light receiving surface (sensor unit) of the imaging device 1.

As the imaging device 1, the imaging device 1 of any of the configuration examples described above is applied. In the imaging device 1, electrons are accumulated for a certain period according to an image formed on the light receiving surface via the optical system 12. Then, a signal corresponding to the electrons accumulated in the imaging device 1 is supplied to the DSP 14.

The DSP 14 performs various types of signal processing on the signal from the imaging device 1 to acquire an image, and temporarily stores data of the image in the memory 18. The image data stored in the memory 18 is recorded in the recording device 19 or supplied to the display device 15 to display an image. The operation system 16 receives various operations by the user and supplies an operation signal to each block of the electronic device 10, and the power supply system 20 supplies power necessary for driving each block of the electronic device 10.

12. Application Example to Endoscopic Surgical System

The technology according to the present disclosure (present technology) can be applied to various products. For example, the technology according to the present disclosure may be applied to an endoscopic surgical system.

Figure 27:
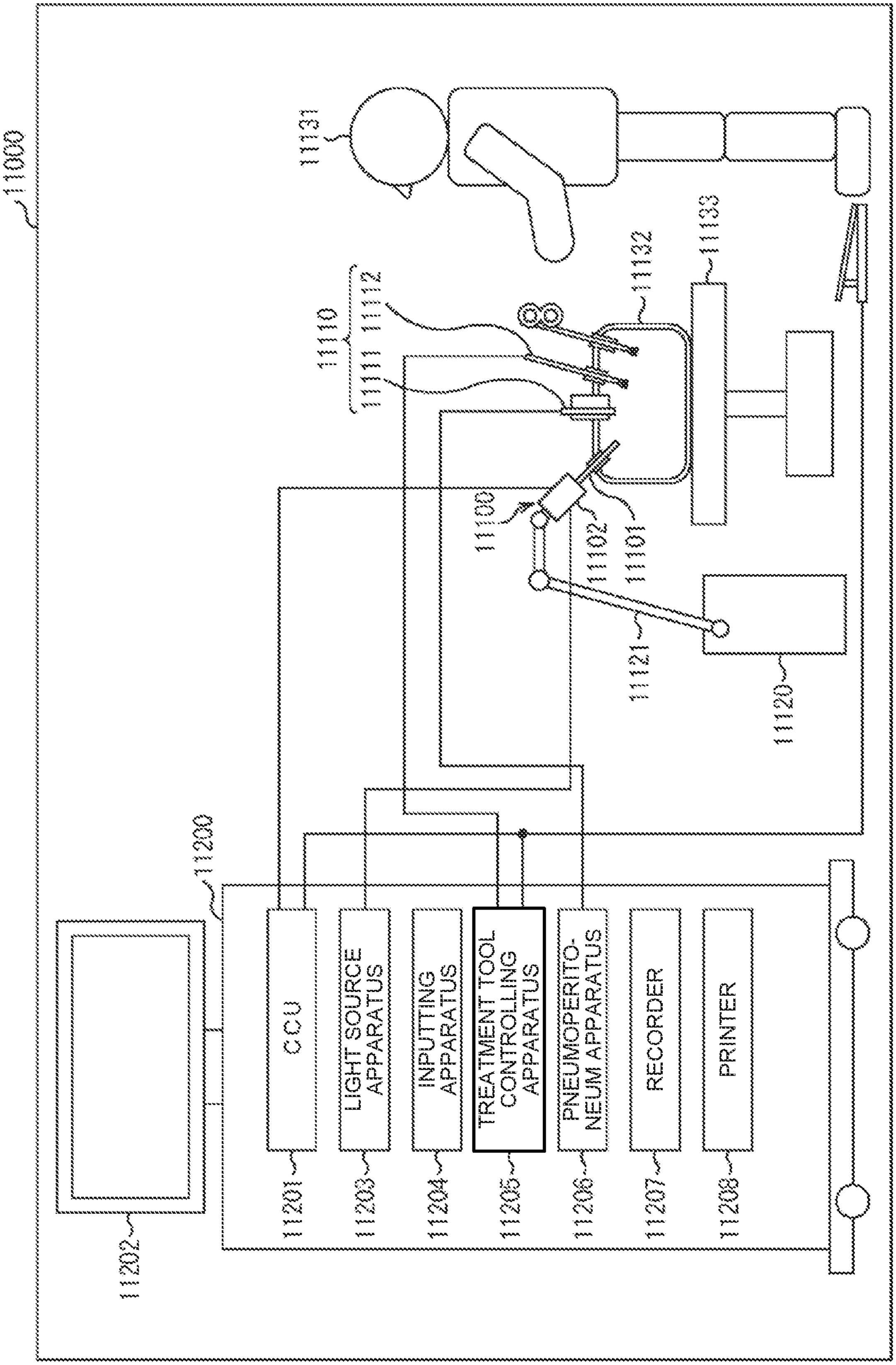
FIG. 27 is a view depicting an example of a schematic configuration of an endoscopic surgery system.

FIG. 27 is a view depicting an example of a schematic configuration of an endoscopic surgery system to which the technology according to an embodiment of the present disclosure (present technology) can be applied.

In FIG. 27, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy treatment tool 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body lumen of the patient 11132, and a camera head 11102 connected to a proximal end of the lens barrel 11101. In the example depicted, the endoscope 11100 is depicted which includes as a hard mirror having the lens barrel 11101 of the hard type. However, the endoscope 11100 may otherwise be included as a soft mirror having the lens barrel 11101 of the soft type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body lumen of the patient 11132 through the objective lens. It is to be noted that the endoscope 11100 may be a direct view mirror or may be a perspective view mirror or a side view mirror.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy treatment tool 11112 for cautery or incision of a tissue, sealing of a blood vessel or the like. A pneumoperitoneum apparatus 11206 feeds gas into a body lumen of the patient 11132 through the pneumoperitoneum tube 11111 to inflate the body lumen in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 28:
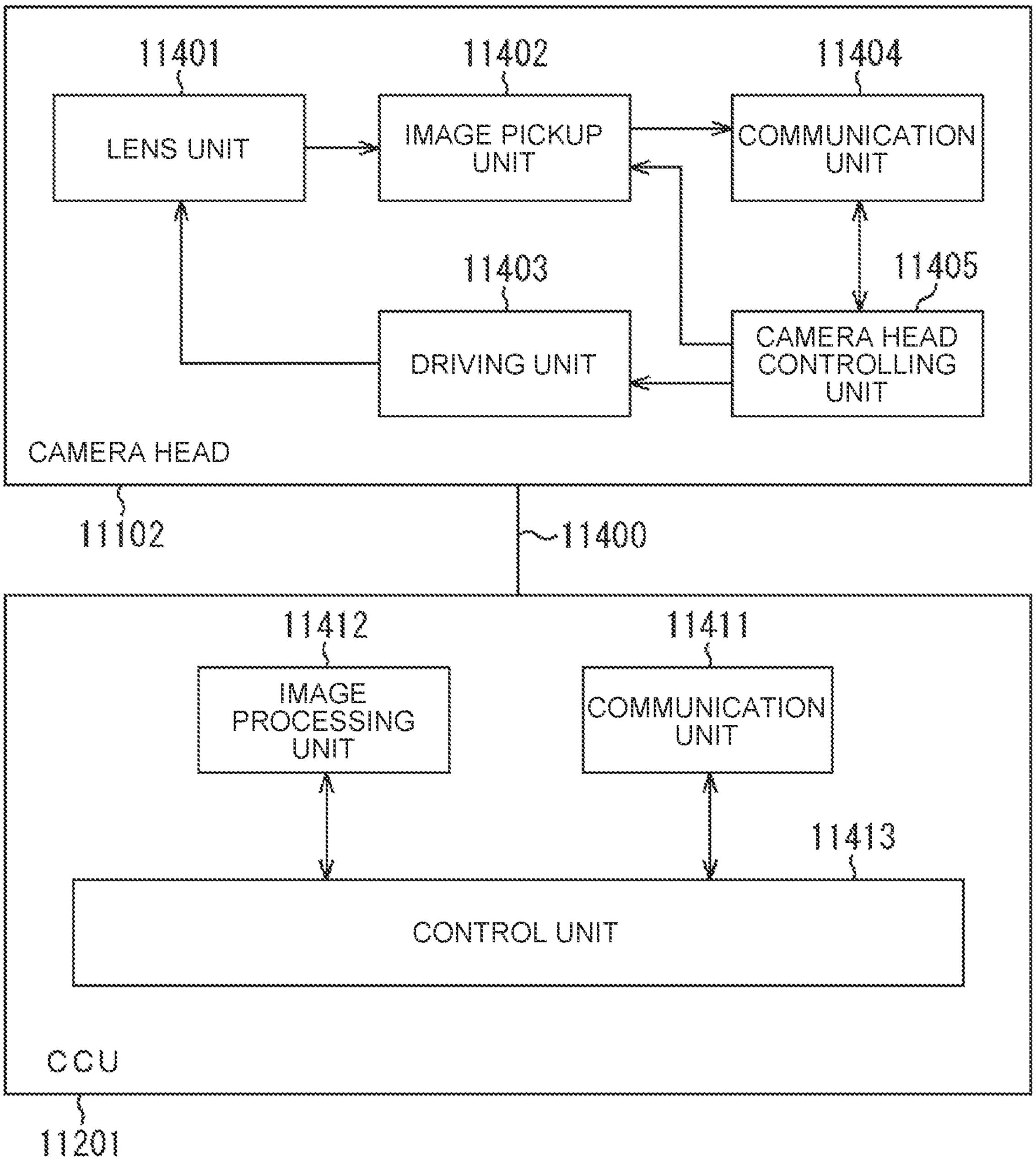
FIG. 28 is a block diagram depicting an example of a functional configuration of a camera head and a camera control unit (CCU).

FIG. 28 is a block diagram depicting an example of a functional configuration of the camera head 11102 and the CCU 11201 depicted in FIG. 27.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy treatment tool 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of the endoscopic surgical system to which the technology according to the present disclosure can be applied has been described above. The technology according to the present disclosure may be applied to the endoscope 11100, the image pickup unit 11402 of the camera head 11102, the image processing unit 11412 of the CCU 11201 among the above-described configurations, for example.

Note that, here, the endoscopic surgical system has been described as an example, but the technology according to the present disclosure may be applied to, for example, a microscopic surgical system or the like.

13. Application Example to Mobile Body

The technology according to the present disclosure (present technology) can be applied to various products. For example, the technology according to the present disclosure may be realized as a device mounted on any type of mobile body such as an automobile, an electric vehicle, a hybrid electric vehicle, a motorcycle, a bicycle, a personal mobility, an airplane, a drone, a vessel, and a robot.

Figure 29:
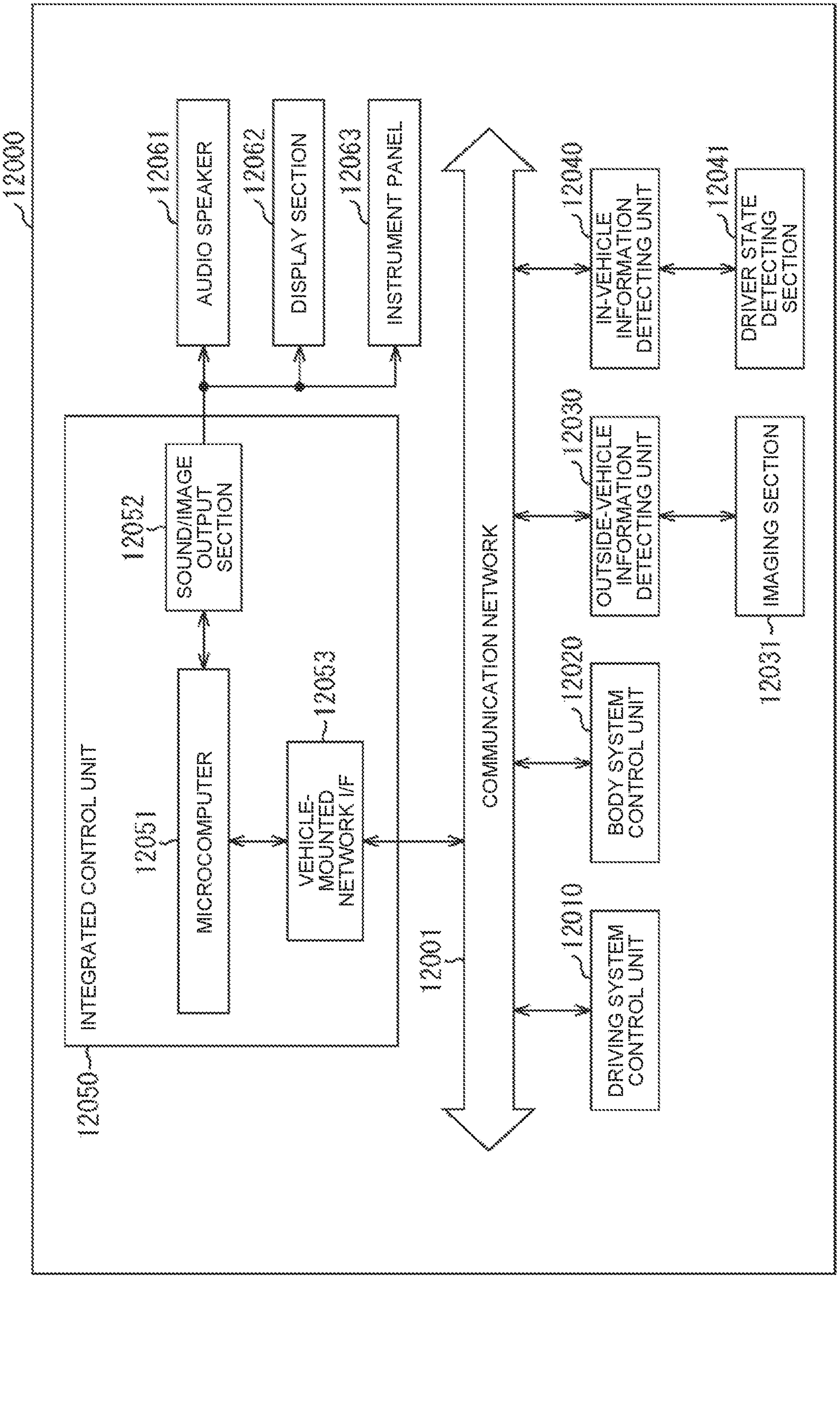
FIG. 29 is a block diagram depicting an example of schematic configuration of a vehicle control system.

FIG. 29 is a block diagram depicting an example of schematic configuration of a vehicle control system as an example of a mobile body control system to which the technology according to an embodiment of the present disclosure can be applied.

A vehicle control system 12000 includes a plurality of electronic control units connected to each other via a communication network 12001. In the example depicted in FIG. 29, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 29, an audio speaker 12061, a display section 12062, and an instrument panel 12063 are illustrated as the output device. The display section 12062 may, for example, include at least one of an on-board display and a head-up display.

Figure 30:
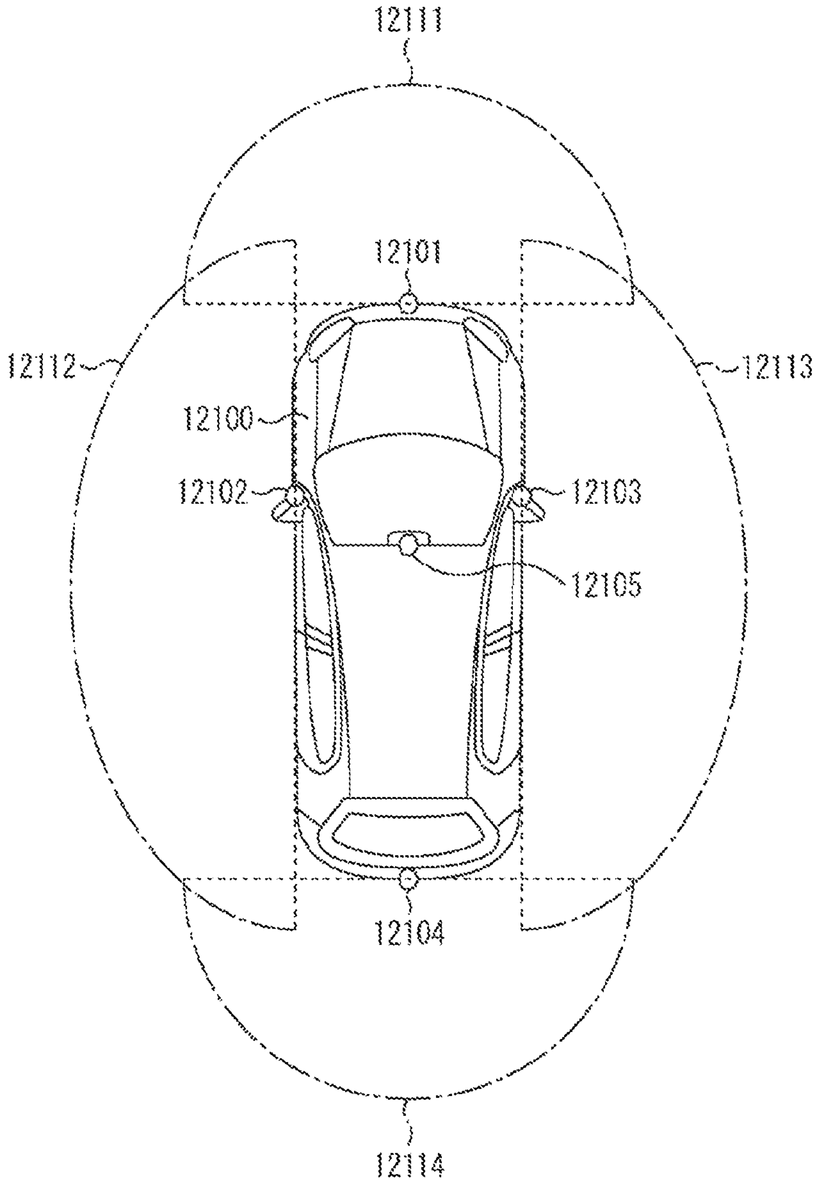
FIG. 30 is a diagram of assistance in explaining an example of installation positions of an outside-vehicle information detecting section and an imaging section.

FIG. 30 is a diagram depicting an example of the installation position of the imaging section 12031.

In FIG. 30, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of a vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 30 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure can be applied has been described above. The technology according to the present disclosure may be applied to the imaging section 12031 and the like among the configurations described above.

14. Supplement

Although the preferred embodiments of the present disclosure have been described in detail with reference to the accompanying drawings, the technical scope of the present disclosure is not limited to such examples. It is obvious that a person having ordinary knowledge in the technical field of the present disclosure can conceive various changes or modifications within the scope of the technical idea described in the claims, and it is naturally understood that these also belong to the technical scope of the present disclosure.

The effects described in the present specification are merely illustrative or exemplary, and are not restrictive. That is, the technology according to the present disclosure can exhibit other effects obvious to those skilled in the art from the description of the present specification together with or instead of the above effects.

The present technology may also take the following configurations.

(1) A light receiving element comprising:

a semiconductor substrate;

a photoelectric conversion unit that is provided in the semiconductor substrate and converts light into charges;

a charge holding unit that is provided in the semiconductor substrate and holds the charges; and a transfer transistor that transfers the charges from the photoelectric conversion unit to the charge holding unit, wherein the transfer transistor includes a gate electrode having a pair of first embedded gate units embedded in the semiconductor substrate.

(2) The light receiving element according to (1), wherein when viewed from above the semiconductor substrate, the photoelectric conversion unit is provided at a central part of the light receiving element, the charge holding unit is provided at an end part of the light receiving element, and the transfer transistor is provided between the photoelectric conversion unit and the charge holding unit.

(3) The light receiving element according to (2), wherein each of the pair of first embedded gate units is provided in a substantially rectangular shape in a section obtained by cutting the light receiving element along a direction parallel to a surface of the semiconductor substrate.

(4) The light receiving element according to (2), wherein each of the pair of first embedded gate units is provided in a substantially elliptical shape in a section obtained by cutting the light receiving element along a direction parallel to a surface of the semiconductor substrate.

(5) The light receiving element according to (2), wherein each of the pair of first embedded gate units is provided to have a center line drawing an arc in a section obtained by cutting the light receiving element along a direction parallel to a surface of the semiconductor substrate.

(6) The light receiving element according to any one of (3) to (5), wherein in the section, the pair of first embedded gate units are provided to have a distance between one of the first embedded gate units and the other one of the first embedded gate units gradually increasing along a direction from a center of the light receiving element toward a center of the charge holding unit.

(7) The light receiving element according to (3), wherein in the section, a long side of the substantially rectangular shape extends along a direction from a center of the light receiving element toward a center of the charge holding unit.

(8) The light receiving element according to (4), wherein in the section, a major axis of the substantially elliptical shape extends along a direction from a center of the light receiving element toward a center of the charge holding unit.

(9) The light receiving element according to any one of (1) to (8), wherein a part of side surfaces of the pair of first embedded gate units is covered with a first oxide film, and remaining parts of the side surfaces of the pair of first embedded gate units are covered with a second oxide film having a larger film thickness than the first oxide film.

(10) The light receiving element according to (9), wherein the second oxide film covers a side surface of one of the first embedded gate units, the side surface being positioned on an opposite side of a side surface facing the other one of the first embedded gate units.

(11) The light receiving element according to (10), further comprising a pixel isolation unit surrounding the light receiving element, wherein the second oxide film is provided to spread between the pair of first embedded gate units and the pixel isolation unit.

(12) The light receiving element according to (10) or (11), wherein the second oxide film covers side surfaces of the pair of first embedded gate units, the side surfaces facing the photoelectric conversion unit.

(13) The light receiving element according to any one of (2) to (12), wherein the gate electrode of the transfer transistor further includes a second embedded gate unit embedded in the semiconductor substrate between the pair of first embedded gate units.

(14) The light receiving element according to (13), wherein the second embedded gate unit is provided in a substantially circular shape in a section obtained by cutting the light receiving element along a direction parallel to a surface of the semiconductor substrate.

(15) The light receiving element according to (13) or (14), wherein a side surface of the second embedded gate unit is covered with a third oxide film.

(16) The light receiving element according to any one of (13) to (15), wherein when viewed from above the semiconductor substrate, the second embedded gate unit is positioned closer to the charge holding unit than each center of the first embedded gate units.

(17) The light receiving element according to any one of (13) to (15), wherein when viewed from above the semiconductor substrate, the second embedded gate unit is positioned farther from the charge holding unit than each center of the first buried gate units.

(18) A light receiving device comprising a plurality of light receiving elements, wherein each of the light receiving elements includes:

a semiconductor substrate;

a photoelectric conversion unit that is provided in the semiconductor substrate and converts light into charges;

a charge holding unit that is provided in the semiconductor substrate and holds the charges; and a transfer transistor that transfers the charges from the photoelectric conversion unit to the charge holding unit, and the transfer transistor includes a gate electrode having a pair of first embedded gate units embedded in the semiconductor substrate.

(19) The light receiving device according to (18), wherein the plurality of light receiving elements share the charge holding unit.

(20) An electronic device on which a light receiving device having a plurality of light receiving elements is mounted, wherein each of the light receiving elements includes:

a semiconductor substrate;

a photoelectric conversion unit that is provided in the semiconductor substrate and converts light into charges;

a charge holding unit that is provided in the semiconductor substrate and holds the charges; and a transfer transistor that transfers the charges from the photoelectric conversion unit to the charge holding unit, and the transfer transistor includes a gate electrode having a pair of first embedded gate units embedded in the semiconductor substrate.

REFERENCE SIGNS LIST

1 IMAGING DEVICE
10 ELECTRONIC DEVICE
12 OPTICAL SYSTEM
14 DSP
15 DISPLAY DEVICE
16 OPERATION SYSTEM
17 BUS
18 MEMORY
19 RECORDING DEVICE
20 POWER SUPPLY SYSTEM
30 PIXEL REGION
32 VERTICAL DRIVE CIRCUIT UNIT
34 COLUMN SIGNAL PROCESSING CIRCUIT UNIT
36 HORIZONTAL DRIVE CIRCUIT UNIT
38 OUTPUT CIRCUIT UNIT
40 CONTROL CIRCUIT UNIT
42 PIXEL DRIVE WIRING
44 VERTICAL SIGNAL LINE
46 HORIZONTAL SIGNAL LINE
48 INPUT/OUTPUT TERMINAL
100, **100*a*, 100*b*** IMAGING ELEMENT
102 SEMICONDUCTOR SUBSTRATE
104 PIXEL ISOLATION UNIT
200 GATE ELECTRODE
202, **202*a*, 202*b*, 210** EMBEDDED UNIT
204, 206, 212, 402 INSULATING FILM
300 ON-CHIP LENS
302 PLANARIZATION FILM
304 ANTIREFLECTION FILM
306 LIGHT SHIELDING FILM
400 WIRING LAYER
404 WIRING
AMP AMPLIFICATION TRANSISTOR
FC CAPACITOR
FD FLOATING DIFFUSION REGION
FDG CONVERSION EFFICIENCY SWITCHING TRANSISTOR
PD PHOTODIODE
RST RESET TRANSISTOR
SEL SELECTION TRANSISTOR
TG TRANSFER TRANSISTOR
VDD POWER SUPPLY POTENTIAL
VG VERTICAL TRANSFER TRANSISTOR
VSL SIGNAL LINE

What is claimed is:

1. A light receiving element, comprising:
a semiconductor substrate;
an isolation region provided around a perimeter of the semiconductor substrate in a plan view;
a photoelectric conversion region that is provided in the semiconductor substrate and converts light into charges;
a charge holding region that is provided in the semiconductor substrate and holds the charges; and
a transfer transistor that transfers the charges from the photoelectric conversion region to the charge holding region,
wherein the transfer transistor includes a gate electrode having a pair of first embedded gate units embedded in the semiconductor substrate,
wherein an area of the transfer transistor is greater than an area of the pair of first embedded gate units such that the pair of first embedded gate units are disposed entirely within the area of the transfer transistor in the plan view, and
wherein the pair of first embedded gate units do not overlap with the isolation region in the plan view.

2. The light receiving element according to claim 1, wherein when viewed from above the semiconductor substrate, the photoelectric conversion region is provided at a central part of the light receiving element, the charge holding region is provided at an end part of the light receiving element, and the transfer transistor is provided between the photoelectric conversion region and the charge holding region.

3. The light receiving element according to claim 2, wherein each of the pair of first embedded gate units is provided in a substantially rectangular shape in a section obtained by cutting the light receiving element along a direction parallel to a surface of the semiconductor substrate.

4. The light receiving element according to claim 2, wherein each of the pair of first embedded gate units is provided in a substantially elliptical shape in a section obtained by cutting the light receiving element along a direction parallel to a surface of the semiconductor substrate.

5. The light receiving element according to claim 2, wherein each of the pair of first embedded gate units is provided to have a center line drawing an arc in a section obtained by cutting the light receiving element along a direction parallel to a surface of the semiconductor substrate.

6. The light receiving element according to claim 3, wherein in the section, the pair of first embedded gate units are provided to have a distance between one of the first embedded gate units and the other one of the first embedded gate units gradually increasing along a direction from a center of the light receiving element toward a center of the charge holding region.

7. The light receiving element according to claim 3, wherein in the section, a long side of the substantially rectangular shape extends along a direction from a center of the light receiving element toward a center of the charge holding region.

8. The light receiving element according to claim 4, wherein in the section, a major axis of the substantially elliptical shape extends along a direction from a center of the light receiving element toward a center of the charge holding region.

9. The light receiving element according to claim 1, wherein
a part of side surfaces of the pair of first embedded gate units is covered with a first oxide film, and
remaining parts of the side surfaces of the pair of first embedded gate units are covered with a second oxide film having a larger film thickness than the first oxide film.

10. The light receiving element according to claim 9, wherein the second oxide film covers a side surface of one of the first embedded gate units, the side surface being positioned on an opposite side of a side surface facing the other one of the first embedded gate units.

11. The light receiving element according to claim 10, further comprising
a pixel isolation region surrounding the light receiving element, wherein
the second oxide film is provided to spread between the pair of first embedded gate units and the pixel isolation region.

12. The light receiving element according to claim 10, wherein the second oxide film covers side surfaces of the pair of first embedded gate units, the side surfaces facing the photoelectric conversion region.

13. The light receiving element according to claim 2, wherein the gate electrode of the transfer transistor further includes a second embedded gate unit embedded in the semiconductor substrate between the pair of first embedded gate units.

14. The light receiving element according to claim 13, wherein the second embedded gate unit is provided in a substantially circular shape in a section obtained by cutting the light receiving element along a direction parallel to a surface of the semiconductor substrate.

15. The light receiving element according to claim 13, wherein a side surface of the second embedded gate unit is covered with a third oxide film.

16. The light receiving element according to claim 13, wherein when viewed from above the semiconductor substrate, the second embedded gate unit is positioned closer to the charge holding region unit than each center of the first embedded gate units.

17. The light receiving element according to claim 13, wherein when viewed from above the semiconductor substrate, the second embedded gate unit is positioned farther from the charge holding region than each center of the first embedded buried gate units.

18. A light receiving device, comprising:

a plurality of light receiving elements, wherein each of the light receiving elements comprises:

a semiconductor substrate;

an isolation region provided around a perimeter of the semiconductor substrate in a plan view;

a photoelectric conversion region that is provided in the semiconductor substrate and converts light into charges;

a charge holding region that is provided in the semiconductor substrate and holds the charges; and a transfer transistor that transfers the charges from the photoelectric conversion region to the charge holding region, and wherein the transfer transistor includes a gate electrode having a pair of first embedded gate units embedded in the semiconductor substrate, wherein an area of the transfer transistor is greater than an area of the pair of first embedded gate units such that the pair of first embedded gate units are disposed entirely within the area of the transfer transistor in the plan view, and wherein the pair of first embedded gate units do not overlap with the isolation region in the plan view.

19. The light receiving device according to claim 18, wherein the plurality of light receiving elements share the charge holding region.

20. An electronic device on which a light receiving device having a plurality of light receiving elements is mounted, wherein each of the light receiving elements comprises:

a semiconductor substrate;

an isolation region provided around a perimeter of the semiconductor substrate in a plan view;

a photoelectric conversion region that is provided in the semiconductor substrate and converts light into charges;

a charge holding region that is provided in the semiconductor substrate and holds the charges; and a transfer transistor that transfers the charges from the photoelectric conversion region to the charge holding region, wherein the transfer transistor includes a gate electrode having a pair of first embedded gate units embedded in the semiconductor substrate, wherein an area of the transfer transistor is greater than an area of the pair of first embedded gate units such that the pair of first embedded gate units are disposed entirely within the area of the transfer transistor in the plan view, and wherein the pair of first embedded gate units do not overlap with the isolation region in the plan view.

* * * * *